US008426752B2

(12) United States Patent
Hashikura et al.

(10) Patent No.: US 8,426,752 B2
(45) Date of Patent: Apr. 23, 2013

(54) ELECTRIC CONNECTION BOX

(75) Inventors: Manabu Hashikura, Yokkaichi (JP);
Mitsuaki Kohsaka, Yokkaichi (JP);
Tatsuya Shimizu, Yokkaichi (JP)

(73) Assignees: Sumitomo Wiring Systems, Ltd., Mie (JP); Autonetworks Technologies, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 288 days.

(21) Appl. No.: 12/864,600

(22) PCT Filed: Mar. 12, 2009

(86) PCT No.: PCT/JP2009/054797
§ 371 (c)(1),
(2), (4) Date: Jul. 26, 2010

(87) PCT Pub. No.: WO2009/113631
PCT Pub. Date: Sep. 17, 2009

(65) Prior Publication Data
US 2011/0005826 A1   Jan. 13, 2011

(30) Foreign Application Priority Data

Mar. 12, 2008 (JP) .................................. 2008-063079

(51) Int. Cl.
*H01L 23/48* (2006.01)
(52) U.S. Cl.
USPC ........... 174/528; 174/541; 174/551; 174/561; 439/76.2
(58) Field of Classification Search ............... 174/528, 174/551, 541, 561; 439/76.2
See application file for complete search history.

(56) References Cited

U.S. PATENT DOCUMENTS

| 6,430,054 | B1 * | 8/2002 | Iwata | 361/752 |
| 6,796,808 | B2 * | 9/2004 | Hosoe et al. | 439/76.2 |
| 6,824,398 | B2 * | 11/2004 | Hara | 439/76.2 |
| 2006/0141824 | A1 | 6/2006 | Kubota et al. | |

FOREIGN PATENT DOCUMENTS

| JP | A-2001-186631 | 7/2001 |
| JP | A-2001-309524 | 11/2001 |
| JP | A-2002-127920 | 5/2002 |

(Continued)

OTHER PUBLICATIONS

Written Opinion of the International Searching Authority in International Application No. PCT/JP2009/054797; dated Apr. 7, 2009 (with English-language translation).
International Search Report in International Application No. PCT/JP2009/054797; dated Apr. 7, 2009 (with English-language translation).

(Continued)

*Primary Examiner* — Hung Ngo
(74) *Attorney, Agent, or Firm* — Oliff & Berridge, PLC

(57) ABSTRACT

An electric junction box having a casing and a circuit structure accommodated in the casing. The circuit structure includes a plurality of first bus bars arranged at intervals and synthetic resin members disposed between the adjacent first bus bars and firmly attached to the first bus bars. The synthetic resin members have heat conductivity higher than that of air. Since the heat generated from the first bus bars during electrical connecting can be transmitted to the synthetic resin members, the electric junction box can be prevented from being locally heated to a high temperature.

15 Claims, 24 Drawing Sheets

FOREIGN PATENT DOCUMENTS

| | | |
|---|---|---|
| JP | A-2002-299867 | 10/2002 |
| JP | A-2004-119579 | 4/2004 |
| JP | A-2004-120837 | 4/2004 |
| JP | A-2005-019434 | 1/2005 |
| JP | A-2006-187052 | 7/2006 |
| JP | A-2006-254526 | 9/2006 |
| JP | A-2006-345681 | 12/2006 |

OTHER PUBLICATIONS

Jun. 7, 2012 Japanese Office Action issued in Japanese Patent Application No. 2010-502877 (with translation).

Feb. 14, 2013 Office Action issued in Japanese Patent Application No. JP-A-2010-502877 w/translation.

* cited by examiner

US 8,426,752 B2

ELECTRIC CONNECTION BOX

TECHNICAL FIELD

The present invention relates to an electric connection box.

BACKGROUND ART

Conventionally, as an electric connection box, an electric connection box described in Patent Document 1 is known. In this electric connection box, a circuit component is housed in a casing. The circuit component is formed by insert-molding plural bus bars arranged at intervals using a synthetic resin material. An electronic component is connected, by soldering or the like, to exposed sections of the bus bars exposed from the synthetic resin.

In the synthetic resin section, through holes are formed in positions corresponding to positions among the bus bars adjacent to one another. The through holes are formed to cut tie bars that couple the bus bars adjacent to one another.

Patent Document 1
Japanese Patent Laid-Open No. 2004-120837

However, according to the configuration explained above, spaces are formed by the through holes among the adjacent bus bars. The air has relatively low thermal conductivity. Therefore, it is apprehended that sections in contact with the air in the through holes of the bus bars are filled with heat generated from the bus bars during energization and the bus bars are locally heated. Then, it is apprehended that connection reliability in, for example, soldered sections of the bus bars and the electronic component falls.

There is a need in the art to provide an electric connection box that is suppressed from being locally heated.

SUMMARY

The present invention is an electric connection box including a casing and a circuit component housed in the casing. The circuit component includes plural bus bars arranged at intervals and a synthetic resin material arranged among the plural bus bars adjacent to one another and closely attached to the bus bars. The thermal conductivity of the synthetic resin material is greater than that of the air.

According to the present invention, when the bus bars are energized, heat is generated from the bus bars. The heat generated from the bus bars is transmitted to the synthetic resin material arranged among the bus bars and closely attached to the bus bars. Since the synthetic resin material has the thermal conductivity greater than that of the air, it is possible to suppress the bus bars from being filled with the heat. Consequently, it is possible to suppress the electric connection box from being locally heated.

According to the present invention, it is possible to suppress the electric connection box from being locally heated.

Figure 1:
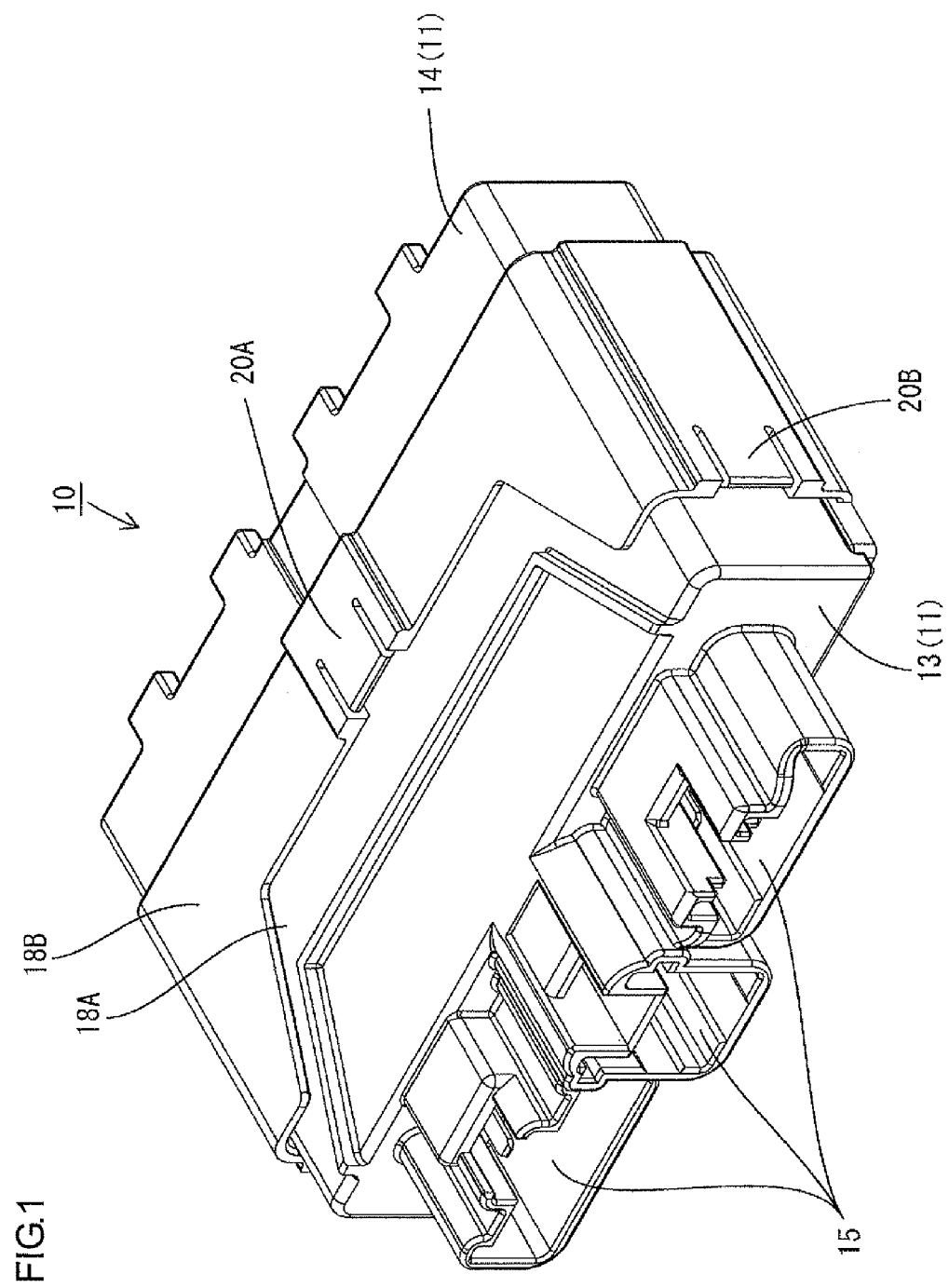
FIG. 1 is a perspective view of an electric connection box according to a first embodiment of the present invention viewed from the front side.

DESCRIPTION OF SYMBOLS 10, 50 . . . electric connection boxes
11, 51 . . . casings
12, 80 . . . circuit components
13, 53 . . . lower cases (casings 11, 51)
14, 54 . . . upper cases (casings 11, 51)
21, 61, 81 . . . first bus bars
22, 62, 82 . . . synthetic resin materials
26, 66, 84 . . . bottom walls
27, 67, 83 . . . sidewalls
28 . . . tie bars
29 . . . cut sections
30 . . . exposing sections
31 . . . relays (electronic components)
34, 88 . . . fillers
35, 89 . . . heat equalizing layers
36 . . . opening
52A . . . front side circuit component (circuit component)
52B . . . rear side circuit component (circuit component)
85 . . . circuit board
86 . . . electronic component

BEST MODE FOR CARRYING OUT THE INVENTION

First Embodiment

A first embodiment in which the present invention is applied to an electric connection box 10 for a vehicle is explained with reference to FIGS. 1 to 12. In the electric connection box 10 according to this embodiment, a circuit component 12 in which a circuit is formed is housed in a casing 11 made of synthetic resin. This electric connection box 10 is connected between a power source (not shown) such as a battery and vehicle-mounted electric components (not shown) such as a headlamp and a windshield wiper and performs energization and de-energization of the vehicle-mounted electric components.

Figure 2:
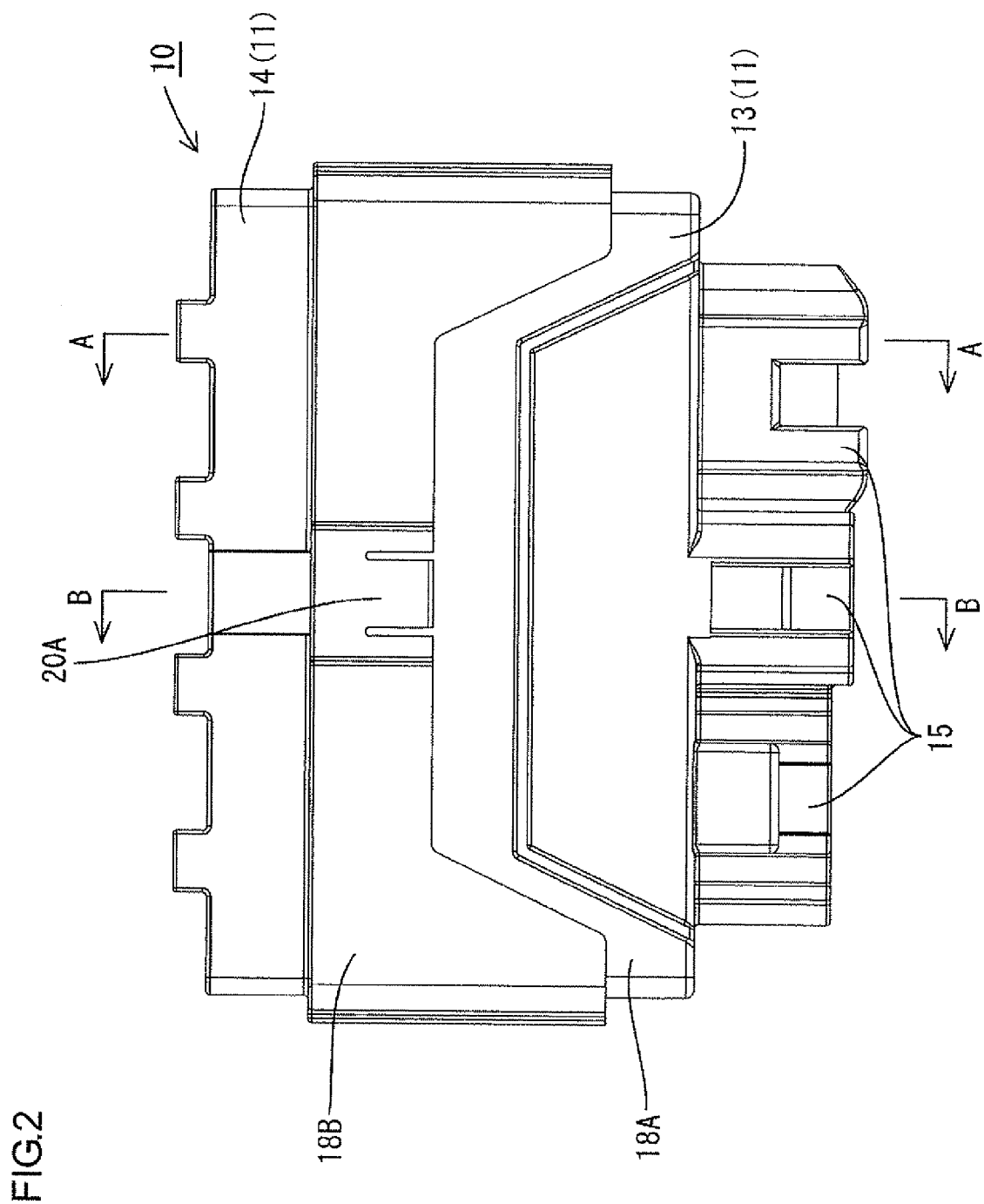
FIG. 2 is a front view of the electric connection box.

In the following explanation, upward in FIG. 2 is referred to as upward and downward on in FIG. 2 is referred to as downward. The right side in FIG. 2 is referred to as right and the left in FIG. 2 is referred to as left. The front side in a piercing direction through the paper surface in FIG. 2 is referred to as front side and the depth side in the piercing direction through the paper surface in FIG. 2 is referred to as rear side.

(Casing 11)

The casing 11 includes a lower case 13 located on the lower side in FIG. 2 and an upper case 14 assembled to an upper part of the lower case 13.

Figure 7:
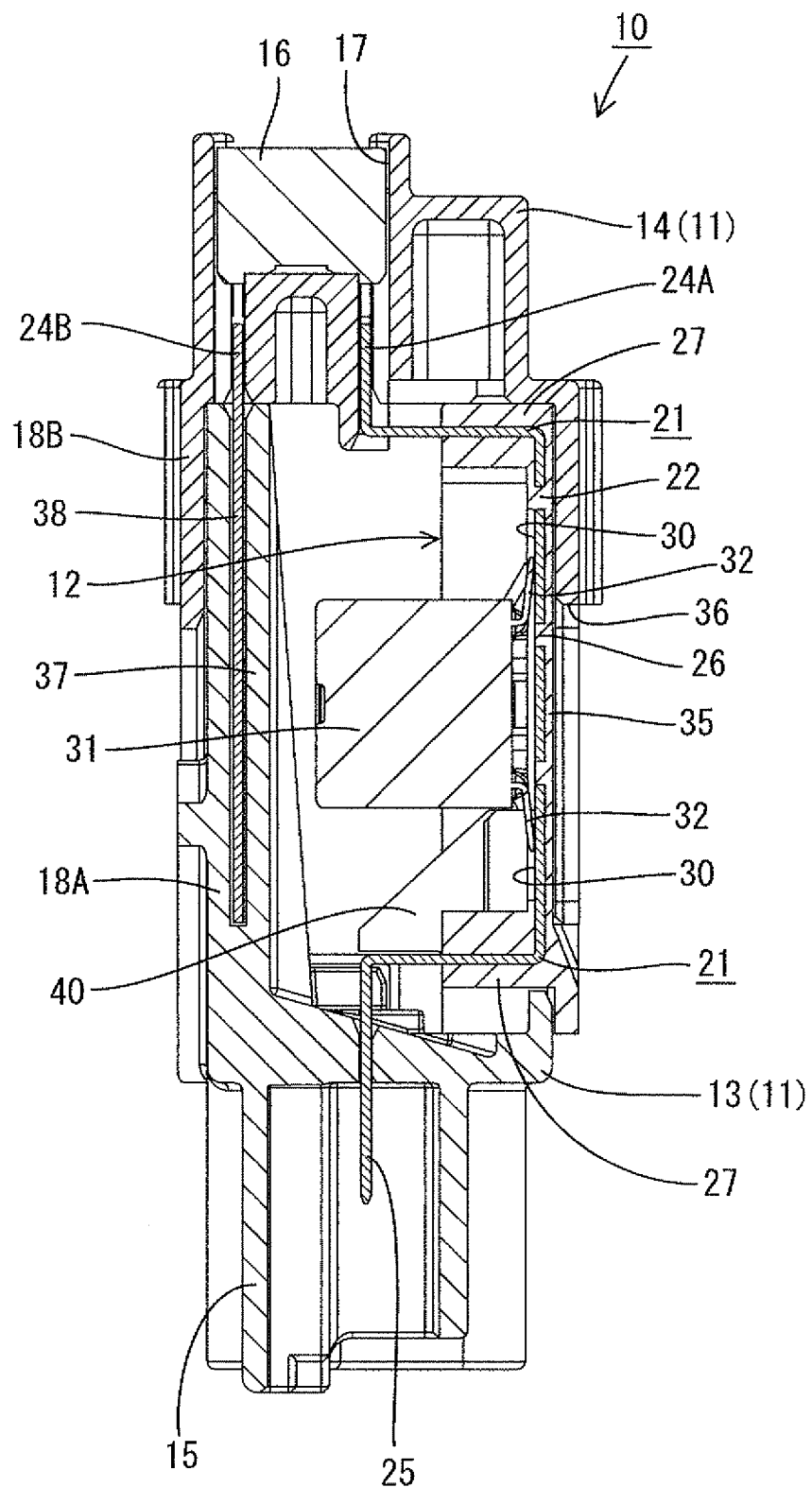
FIG. 7 is a sectional view taken along A-A line in FIG. 2.

As shown in FIG. 7, the lower case 13 is made of synthetic resin and opened upward. A connector housing 15 opened downward is formed on the lower surface of a lower wall of the lower case 13. Not-shown counterpart connectors can be fit in this connector housing 15. The counterpart connector is connected to a battery, vehicle-mounted electric components, and the like via a wire harness (not shown).

As shown in FIG. 7, the circuit component 12 is housed in the opening of the lower case 13 from above. The upper case 14 is assembled to upper parts of the lower case 13 and the circuit component 12 from above. The upper case 14 is made of synthetic resin and opened downward. A fuse inserting section 17 in which fuses 16 can be inserted is opened in an upper wall of the upper case 14. Plural fuses 16 (in this embodiment, four) are inserted in the fuse inserting section 17 (see FIGS. 5 and 6).

Figure 5:
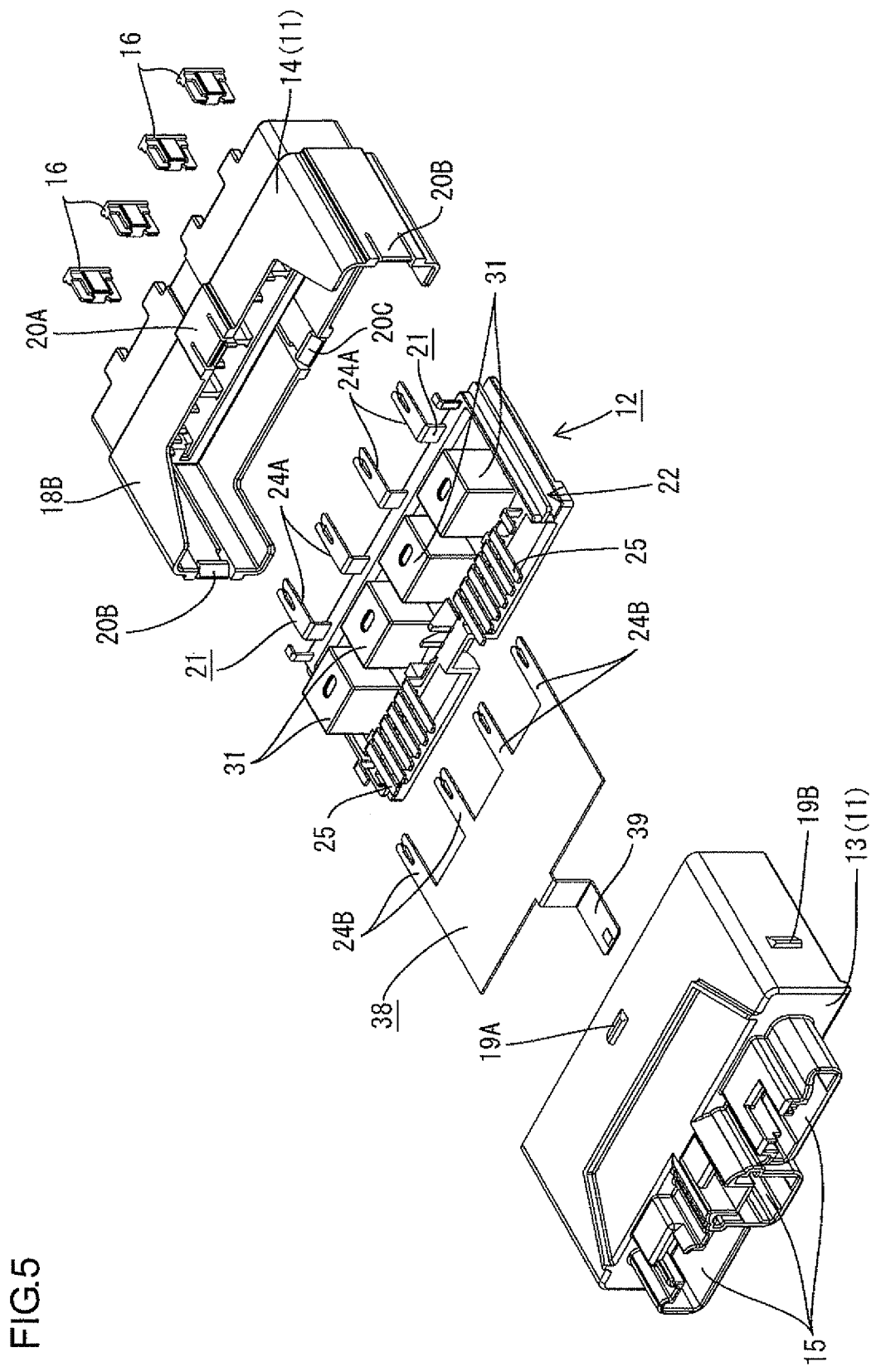
FIG. 5 is a disassembled perspective view of the electric connection box viewed from the front side.
Figure 6:
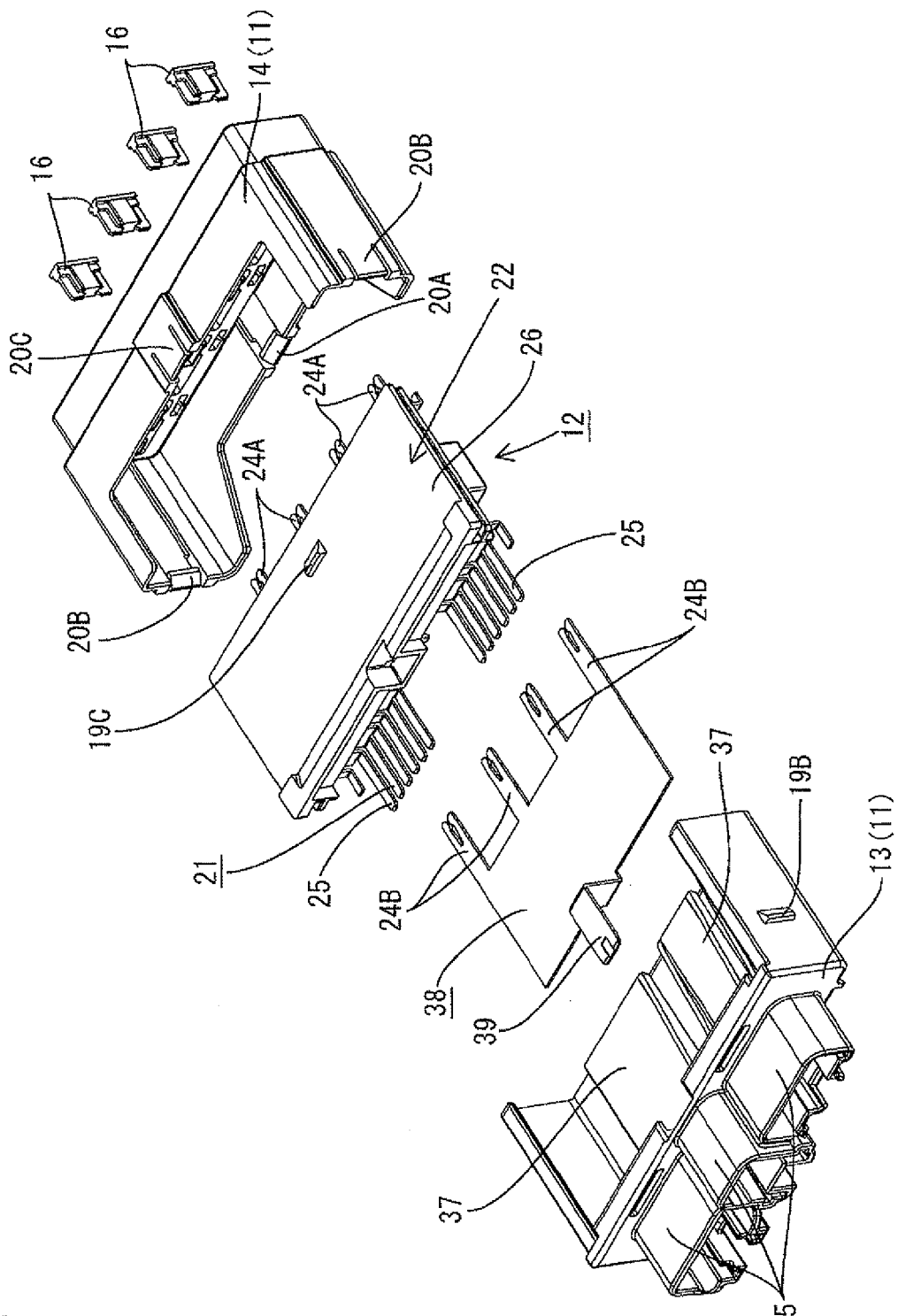
FIG. 6 is a disassembled perspective view of the electric connection box viewed from the rear side.

As shown in FIGS. 1, 2, and 5, a lock section 19A projecting outward is formed on an outer surface of a front wall 18A located on the front side of the lower case 13. On the other hand, an elastically-deformable lock receiving section 20A is formed in a position corresponding to the lock section 19A on an outer surface of a front wall 18B located on the front side of the upper case 14. As shown in FIGS. 5 and 6, lock sections 19B projecting outward are formed on outer surfaces of sidewalls located on both left and right sides of the lower case 13. On the other hand, elastically-deformable lock receiving sections 20B are formed in positions corresponding to the lock sections 19B on sidewalls located on both left and right sides of the upper case 14. The lock sections 19A and 19B and the lock receiving sections 20A and 20B elastically fit, whereby the lower case 13 and the upper case 14 are assembled (see FIG. 8).

(Circuit Component 12)

Figure 9:
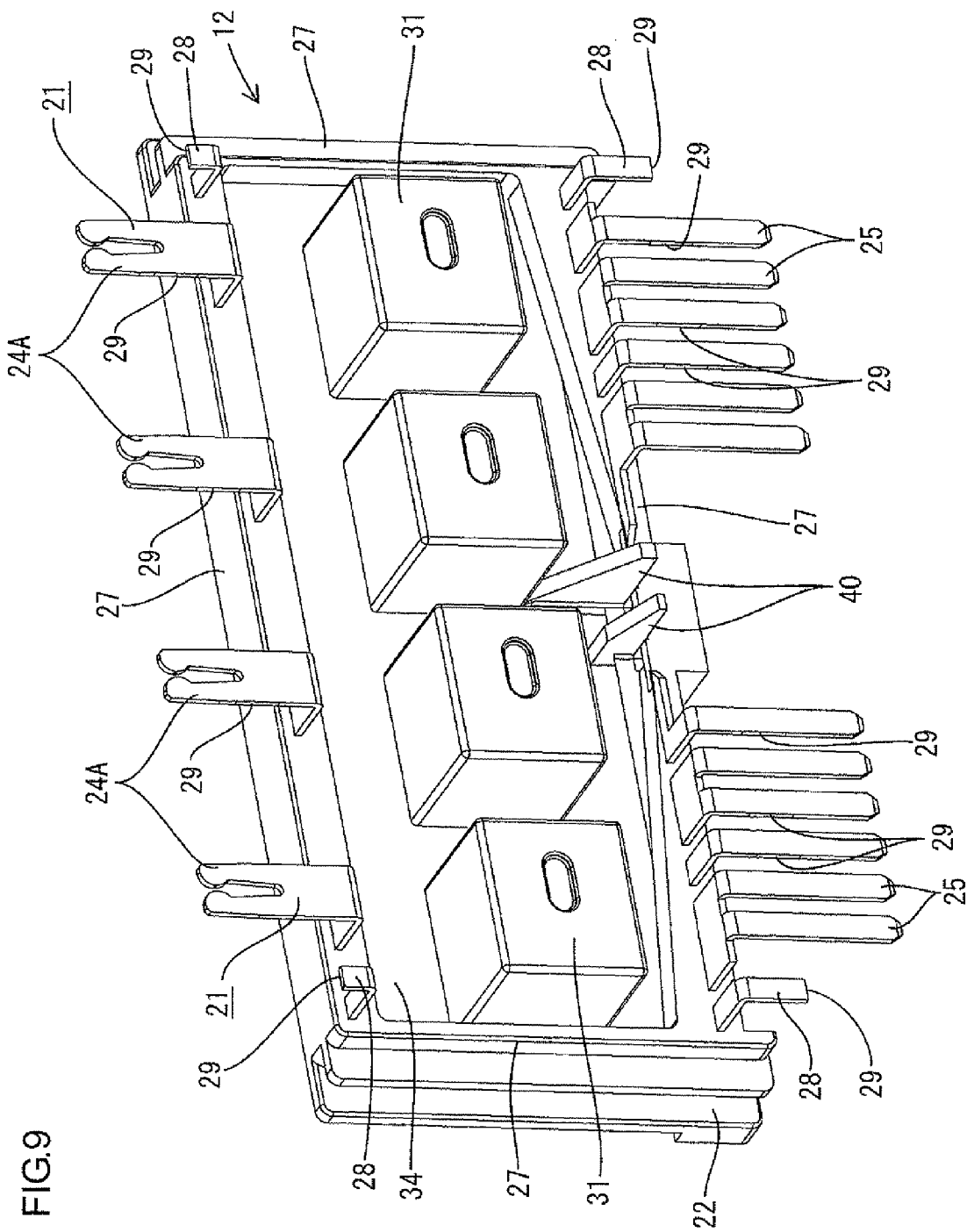
FIG. 9 is a perspective view showing a circuit component.

As shown in FIGS. 7 and 9, the circuit component 12 includes plural first bus bars 21 (corresponding to bus bars) arranged at intervals and a synthetic resin material 22 filled among the first bus bars 21.

The first bus bars 21 are formed by, after the plural first bus bars 21 are formed as coupled bus bars 23 in a form obtained by coupling the first bus bars 21 with tie bars 28 by pressing a metal plate material (see FIG. 10), cutting the tie bars 28. As shown in FIG. 7, the upper ends of the first bus bars 21 are bent at a right angle twice to the front side to be formed in a crank shape. The upper ends of the first bus bars 21 are inserted into the fuse inserting section 17 and formed as fuse side terminals 24A connected to the fuses 16. The lower ends of the first bus bars 21 are also bent at a right angle twice to the front side to be formed in a crank shape. The lower ends of the first bus bars 21 pierce through the lower wall of the lower case 13 and is inserted into the connector housing 15 and formed as connector side terminals 25 connected to the counterpart connectors.

Figure 12:
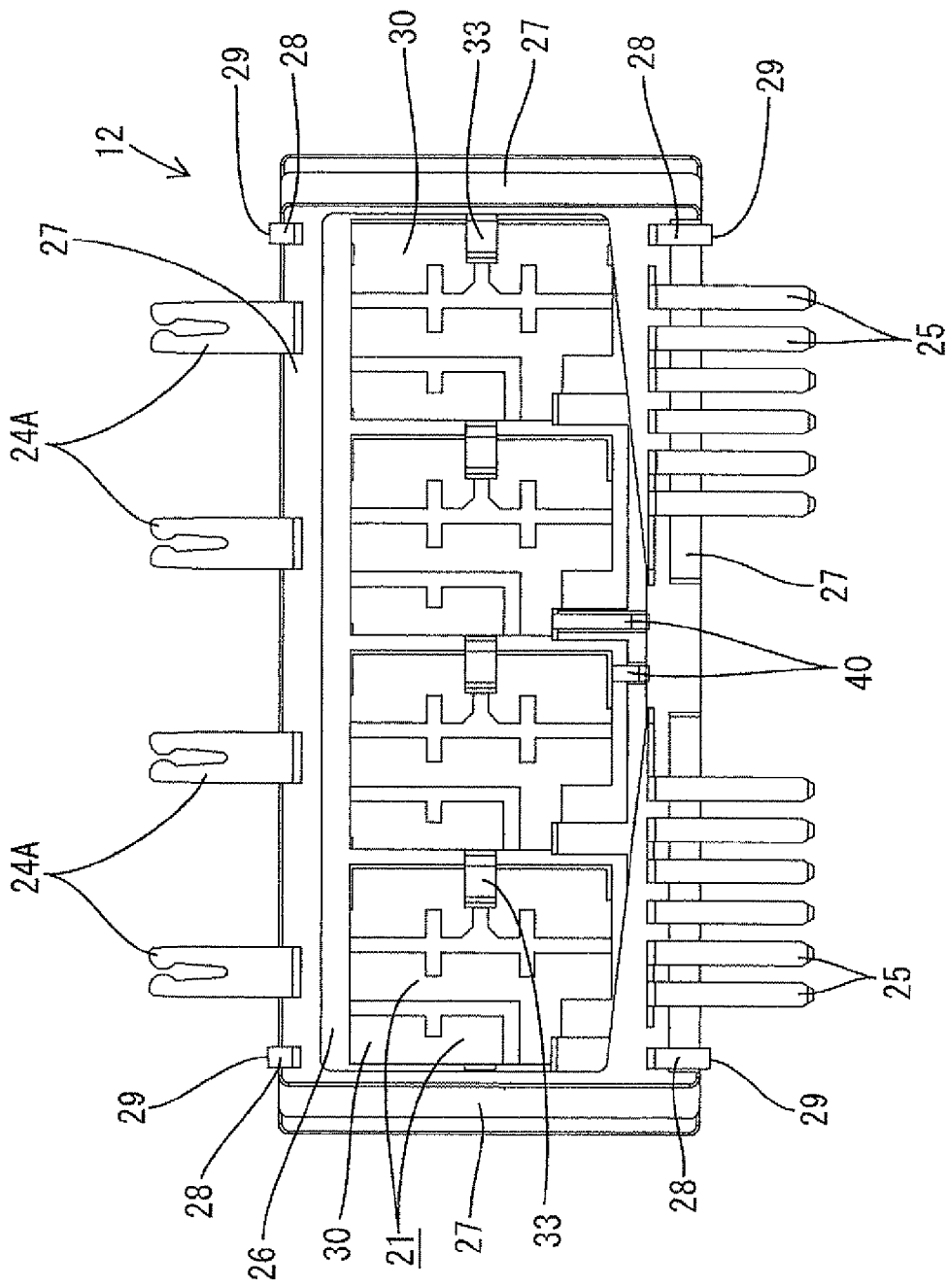
FIG. 12 is a front view showing a state in which tie bars of the insert-molded coupled bus bars are cut.

As shown in FIG. 12, the synthetic resin material 22 having thermal conductivity greater than that of the air is insert-molded in the area between the fuse side terminals 24A and the connector side terminals 25 of the first bus bars 21. The synthetic resin material 22 is filled among the first bus bars 21 adjacent to one another and closely attached to the first bus bars 21.

As shown in FIG. 7, in the circuit component 12, a bottom wall 26 is formed by the synthetic resin material 22. The bottom wall 26 is arranged vertically to the lower wall of the lower case 13. As shown in FIG. 12, the bottom wall 26 is formed in a substantially rectangular shape viewed from the front side. At the outer peripheral edge of the bottom wall 26, four sidewalls 27 are formed to be vertically provided on the front side. The fuse side terminals 24A (in this embodiment, four) project upward from an edge on the front side of the sidewall 27 located on the upper side among the sidewalls 27. As shown in FIG. 9, the upper ends of the fuse side terminals 24A are formed to be divided into two and formed to be capable of nipping the terminals of the fuses 16. The connector side terminals 25 project from an edge on the front side of the sidewall 27 located on the lower side among the sidewalls 27.

As shown in FIG. 9, cut sections 29 obtained by cutting the tie bars 28 that couple the first bus bars 21 are formed in positions closer to the upper end and the lower end than the areas covered with the synthetic resin material 22 in the first bus bars 21. Specifically, the cut sections 29 are formed at the side edges of the fuse side terminals 24A and the connector side terminals 25.

The tie bars 28 that couple the first bus bars 21 project outward from the edge on the front side of the sidewall 27 located on the upper side and the sidewall 27 located on the lower side among the sidewalls 27 of the circuit component 12. The tips of the tie bars 28 are cut to be formed as the cut sections 29.

As shown in FIG. 7, exposing sections 30 in which the first bus bars 21 are exposed from the synthetic resin material 22 are formed on a surface on the side on which the sidewall 27 are vertically provided (a front surface corresponding to a first surface) in the bottom wall 26. Lead terminals 32 of a relay 31 (corresponding to the electronic component) are connected to the exposing sections 30 by, for example, soldering. In this embodiment, four relays 31 are connected to the circuit component 12 (see FIG. 9).

As shown in FIG. 12, aligning projections 33 for aligning the relay 31 are formed to project to the front side on the front surface of the bottom wall 26. The surface of the relay 31 and the aligning projections 33 come into contact with each other, whereby the relay 31 is aligned in a regular position.

Figure 8:
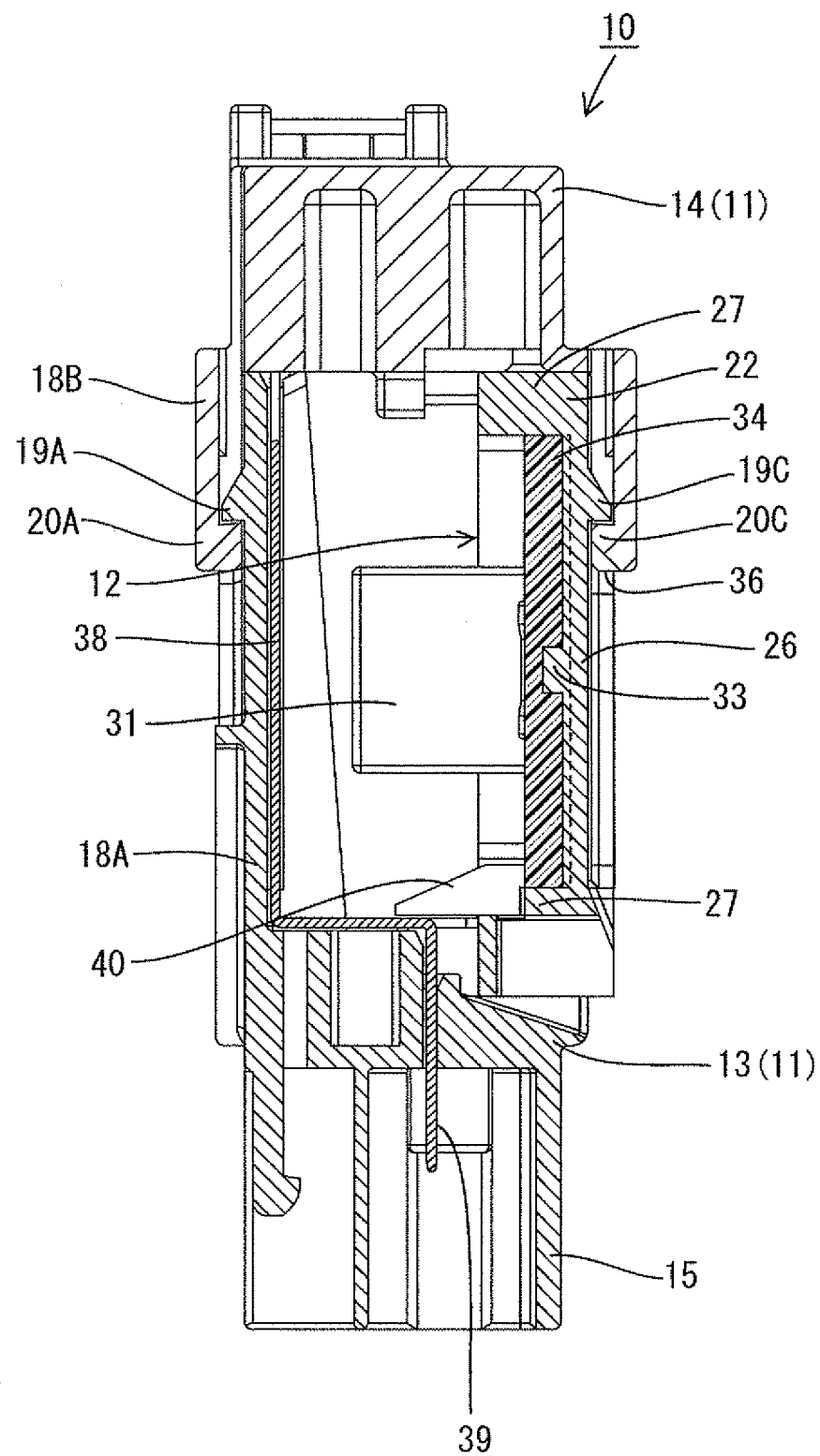
FIG. 8 is a sectional view taken along B-B line in FIG. 2.

As shown in FIGS. 8 and 9, a filler 34 formed of, for example, synthetic resin is filled in an area surrounded by the bottom wall 26 and the four sidewalls 27. The filler 34 cover the exposing sections 30 and is set in contact with the relay 31. In FIG. 7, the filler 34 is omitted.

As shown in FIG. 7, a heat equalizing layer 35 that absorbs heat generated from the first bus bars 21 during energization is formed on a surface on the opposite side of the side on which the relay 31 is inserted (the rear surface corresponding to a second surface, the right side in FIG. 7) to continue to the synthetic resin material 22 filled among the adjacent first bus bars 21 and cover the rear surfaces of the first bus bars 21.

Figure 3:
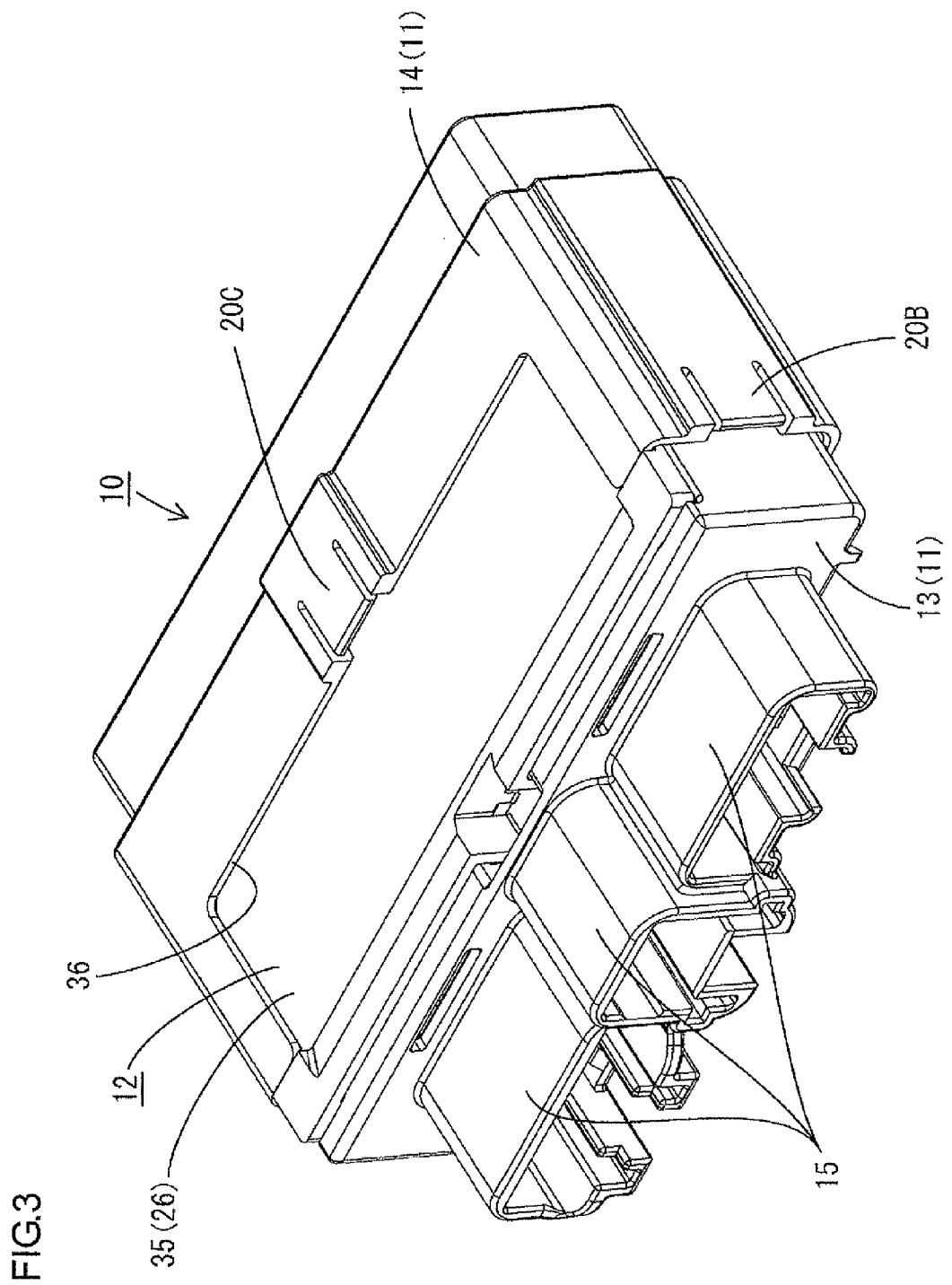
FIG. 3 is a perspective view of the electric connection box viewed from the rear side.
Figure 4:
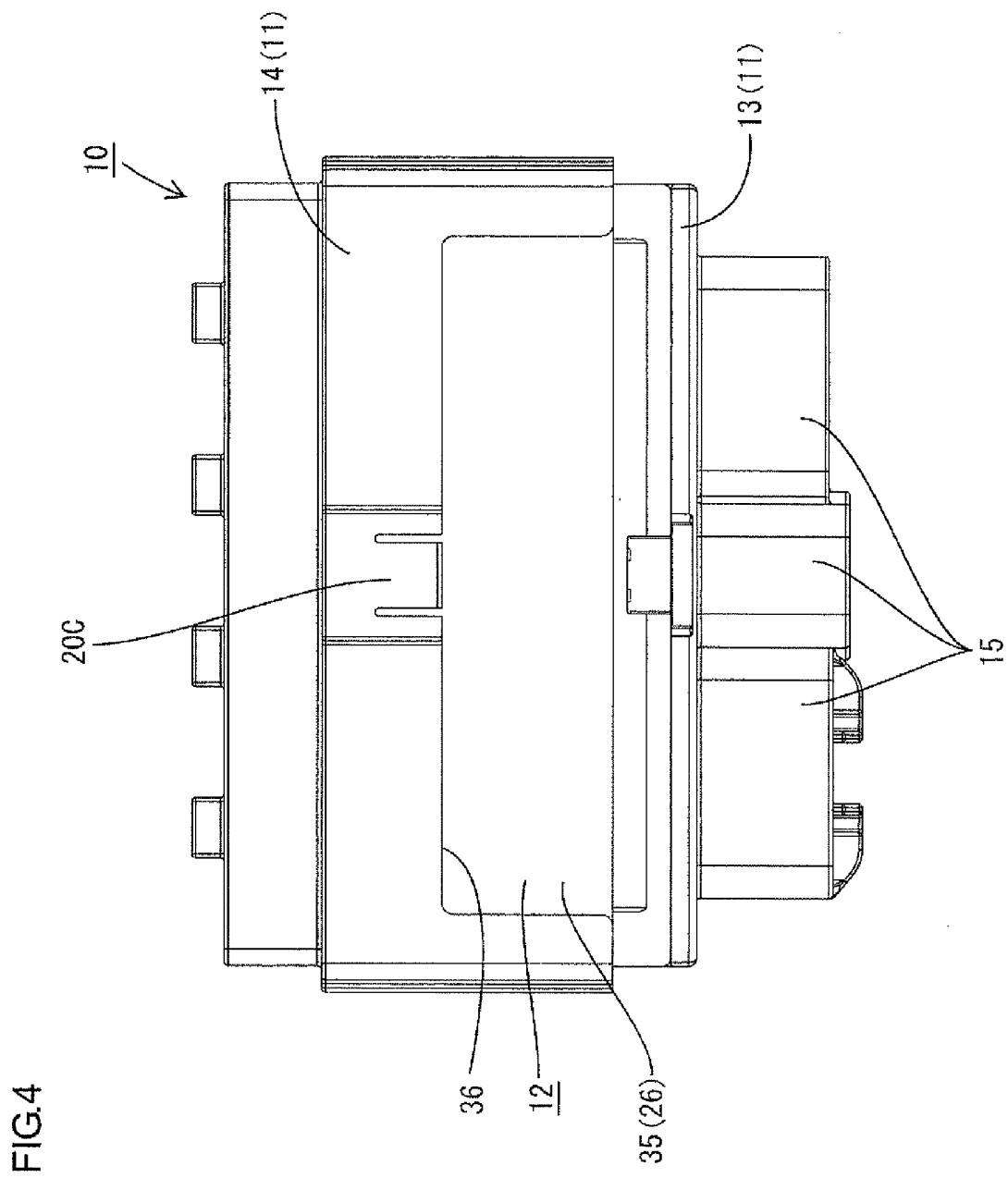
FIG. 4 is a rear view of the electric connection box.

As shown in FIGS. 6 and 8, a lock section 19C projecting outward is formed on the rear surface side of the bottom wall 26 of the circuit component 12 (the rear surface of the heat equalizing layer 35). On the other hand, as shown in FIGS. 3, 4, and 6, an elastically-deformable lock receiving section 20C is formed in a position corresponding to the lock section 19C on the outer surface on the rear side of the upper case 14. This lock section 19C and the lock receiving section 20C elastically fit each other, whereby the circuit component 12 and the upper case 14 are assembled.

As shown in FIGS. 3 and 4, in a state in which the lower case 13, the circuit component 12, and the upper case 14 are assembled, an opening 36 is formed on the rear surface side of the lower case 13 and the upper case 14. The circuit component 12 is housed in the casing 11 in a posture in which this opening 36 is closed by the heat equalizing layer 35 of the bottom wall 26 of the circuit component 12. In other words, the bottom wall 26 of the circuit component 12 configures a part of the outer surface of the casing 11.

(Second Bus Bar 38)

As shown in FIGS. 6 and 7, a nipping section 37 for nipping a second bus bar 38 is formed to open upward on the rear surface of the front wall 18A of the lower case 13. In the casing 11, the second bus bar 38 is disposed to overlap the rear side of the front wall 18A of the lower case 13. The second bus bar 38 is formed by pressing a metal plate material. The plural (in this embodiment, four) fuse side terminals 24B inserted into the fuse inserting section 17 and connected to the fuses 16 project upward from the upper edge of the second bus bar 38. As shown in FIGS. 5 and 6, the upper ends of the fuse side terminals 24B are formed to be divided into two and formed to be capable of nipping the terminals of the fuses 16. A power source side terminal 39 projecting downward (the left front side in FIG. 6) is formed from a position near the center in the left to right direction (a direction from the right front to the left depth in FIG. 6) at the lower edge of the second bus bar 38. As shown in FIG. 8, the power source side terminal 39 is bent at a right angle twice to the rear side (the right side in FIG. 8) to be formed in a crank shape. As shown in FIG. 8, this power source side terminal 39 is inserted into the connector housing 15 piercing through the lower wall of the lower case 13 and connected to a counterpart connector connected to a battery via a wire harness.

As shown in FIGS. 8 and 9, on the sidewall 27 located on the lower side among the sidewalls 27 of the circuit component 12, a pair of regulation ribs 40 for regulating the power source side terminal 39 from being displaced upward from the counterpart connector is fit are formed in a position above the power source side terminal 39. The regulation ribs 40 are adapted to come into contact with the power source side terminal 39 and regulate the power source side terminal 39 from being displaced upward when the counterpart connector is fit and upward force is applied to the power source side terminal 39.

(Manufacturing Process)

Figure 10:
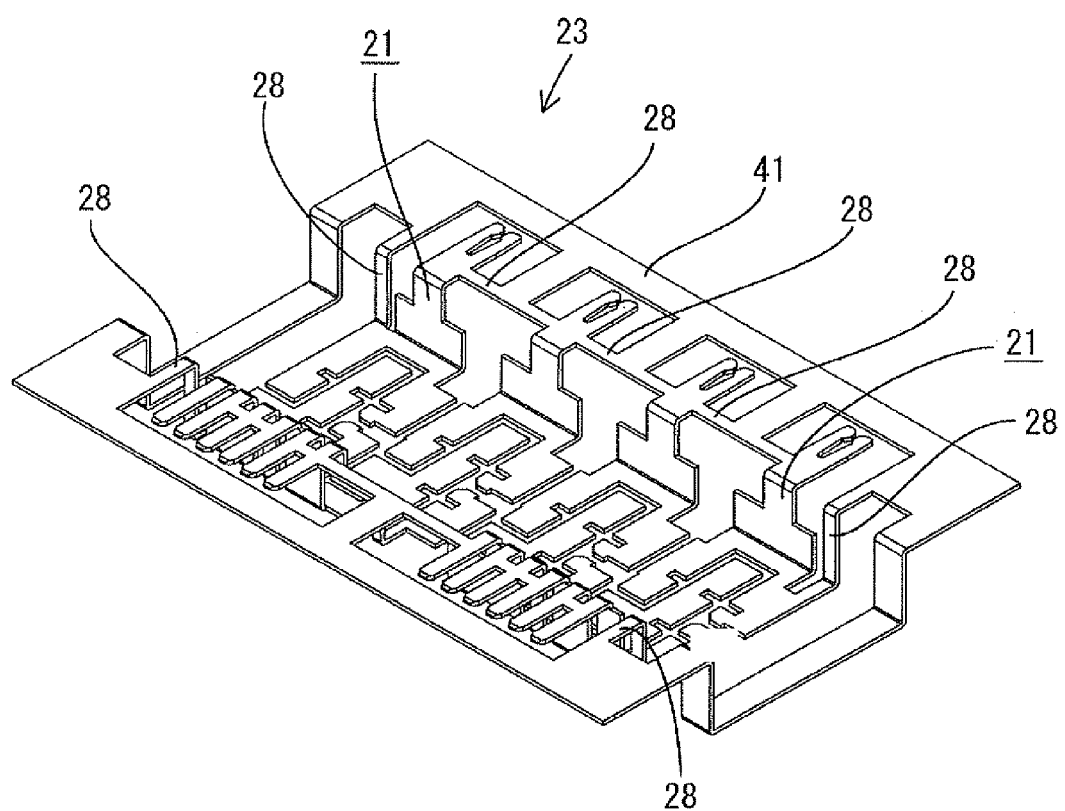
FIG. 10 is a perspective view showing coupled bus bars.

An example of a manufacturing process for the electric connection box 10 according to this embodiment is explained. As shown in FIG. 10, first, a not-shown metal plate member is pressed. By the pressing, the coupled bus bars 23 in a form in which the plural first bus bars 21 are connected by the tie bars 28 are formed on the inner side of a frame 41 formed in a substantially rectangular shape.

Figure 11:
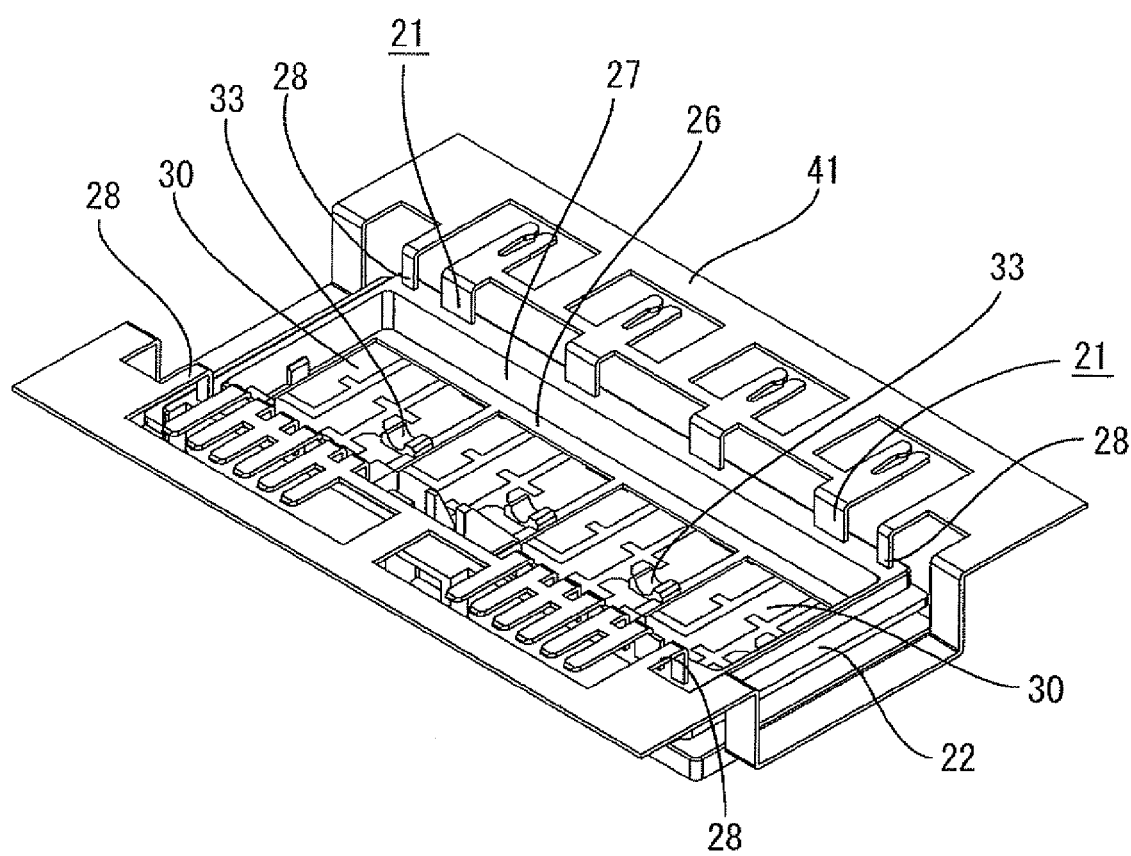
FIG. 11 is a perspective view showing a state in which a synthetic resin material is insert-molded in the coupled bus bars.

The coupled bus bars 23 formed in the above described form is placed in a not-shown die and insert-molded with the synthetic resin material 22. As shown in FIG. 11, the bottom wall 26 and the sidewalls 27 are formed by this step.

Thereafter, as shown in FIG. 12, the tie bars 28 that couple the adjacent first bus bars 21 are cut. By cutting the tie bars 28, the cut sections 29 are formed in the first bus bars 21. The cut sections 29 are formed in the tie bars 28 that project from the synthetic resin material 22.

The relay 31 is arranged in the regular position while the relay 31 is brought into contact with the aligning projection 33 of the bottom wall 26. Thereafter, the lead terminals 32 of the relay 31 and the first bus bars 21 exposed from the exposing sections 30 are soldered by a publicly-known method such as laser soldering or reflow soldering.

Subsequently, the circuit component 12 is placed in a posture in which the bottom wall 26 is set on the lower side and the sidewalls 27 rise upward. Thereafter, the filler 34 of a liquid form is filled in the area surrounded by the bottom wall 26 and the sidewalls 27. The filler 34 is filled to a liquid level at which the filler 34 covers the exposing sections 30 and is set in contact with the relay 31. Thereafter, the filler 34 is solidified (see FIG. 9).

The second bus bar 38 is inserted into the nipping section 37 of the lower case 13. The power source side terminal 39 of the second bus bar 38 is inserted into the connector housing 15 from above. Next, the connector side terminals 25 of the circuit component 12 are inserted into the connector housing 15 from above.

Subsequently, the upper case 14 is assembled to the lower case 13 and the circuit component 12 from above. When the upper case 14 is assembled, the fuse side terminals 24A and 24B of the first bus bars 21 and the second bus bar 38 are housed in the fuse inserting section 17 of the upper case 14. When the upper case 14 is assembled from above, the lock receiving sections 20A, 20B, and 20C of the upper case 14 come into contact with the lock sections 19A, 19B, and 19C of the lower case 13 and the circuit component 12 from above. When the upper case 14 is displaced downward, the lock receiving sections 20A, 20B, and 20C are elastically deformed outward and thereafter deformed to be reset and elastically engage with the lock sections 19A, 19B, and 19C. Consequently, the upper case 14 is assembled integrally with the lower case 13 and the circuit component 12 (see FIG. 8). The electric connection box 10 is completed. As shown in FIGS. 7 and 8, this electric connection box 10 is mounted on a vehicle in a posture in which the bottom wall 26 of the circuit component 12 is upright.

Actions and effects of this embodiment are explained. When the electric connection box 10 is energized, heat is generated from the first bus bars 21. The heat generated from the first bus bars 21 is transmitted to the synthetic resin material 22 filled among the first bus bars 21 and set in close contact with the first bus bars 21. Since the synthetic resin material 22 has thermal conductivity greater than that of the air, it is possible to suppress the first bus bars 21 from being filled with the heat. This makes it possible to suppress the electric connection box 10 from being locally heated.

The heat generated from the first bus bars 21 by the energization of the first bus bars 21 is transmitted to the filler 34 that covers the exposing sections 30. The heat generated from the relay 31 by the energization of the relay 31 is transmitted to the filler 34 set in contact with the relay 31. This makes it possible to suppress the first bus bars 21 and the relay 31 from being filled with the heat.

Further, the heat generated from the first bus bars 21 is transmitted to the synthetic resin material 22 and then transmitted to the heat equalizing layer 35 formed continuously from the synthetic resin material 22. The heat is dispersed by the heat equalizing layer 35. This makes it possible to further suppress the vicinities of the first bus bars 21 from being locally heated.

Moreover, the heat transmitted to the heat equalizing layer 35 is radiated to the outside of the casing 11 from the outer surface of the heat equalizing layer 35 exposed in the opening 36 formed in the casing 11. Consequently, the heat generated from the first bus bars 21 is efficiently radiated to the outside of the casing 11. Therefore, it is possible to further suppress the vicinities of the first bus bars 21 from being locally heated.

According to this embodiment, the circuit component 12 can be manufactured by pressing a metal plate material to form the coupled bus bars 23 in which the plural first bus bars 21 are coupled by the tie bars 28, insert-molding the coupled bus bars 23 to fill the synthetic resin material 22 among the adjacent first bus bars 21, and thereafter cutting the tie bars 28. In this way, according to this embodiment, it is possible to insert-mold the first bus bars 21 in a state in which the first bus bars 21 are coupled by the tie bars 28.

As a result, for example, compared with a process for first cutting the tie bars 28 to divide the plural first bus bars 21 and thereafter respectively arraying the divided plural first bus bars 21 in predetermined position of a die and then insert molding the first bus bars 21, the manufacturing process can be simplified.

Second Embodiment

Figure 13:
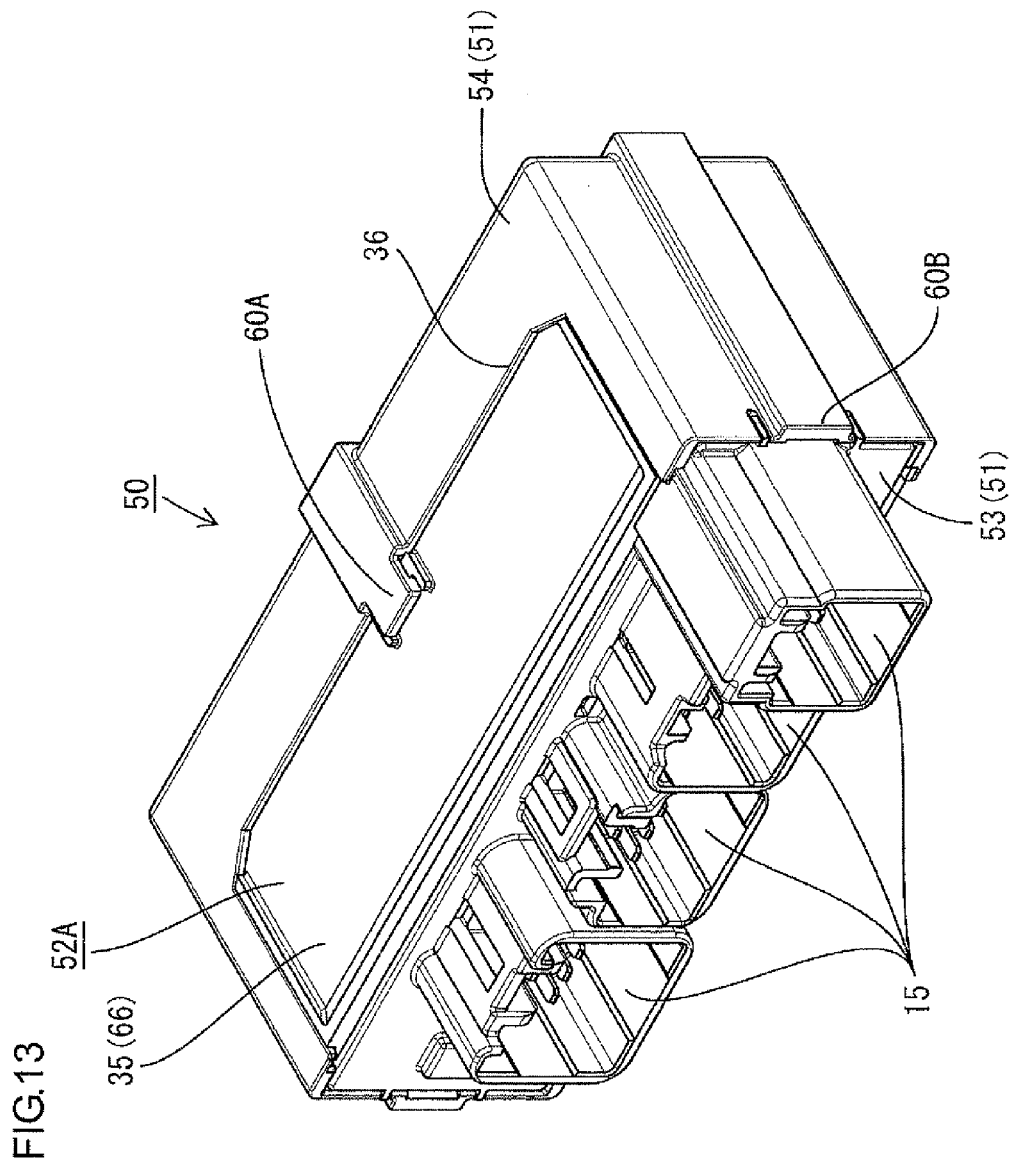
FIG. 13 is a perspective view of an electric connection box according to a second embodiment of the present invention viewed from the front side.
Figure 14:
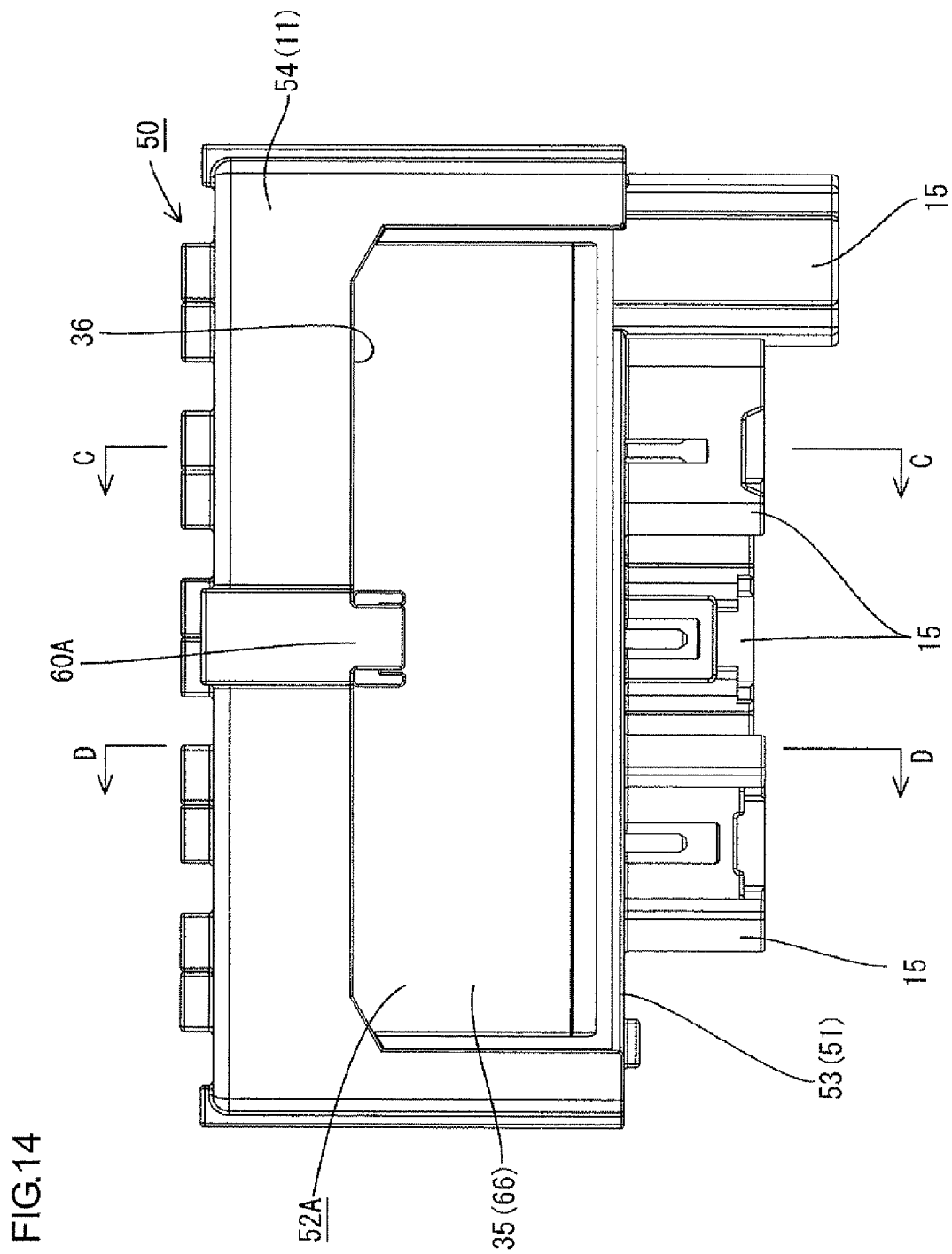
FIG. 14 is a front view of the electric connection box.

Next, a second embodiment of the present invention is explained with reference to FIGS. 13 to 22. In the following explanation, the upper side in FIG. 14 is referred to as upward and the lower side in FIG. 14 is referred to as downward. The right side in FIG. 14 is referred to as right and the left in FIG. 14 is referred to as left. The front side in a piercing direction through the paper surface in FIG. 14 is referred to as front side and the depth side in the piercing direction through the paper surface in FIG. 14 is referred to as rear side.

Figure 18:
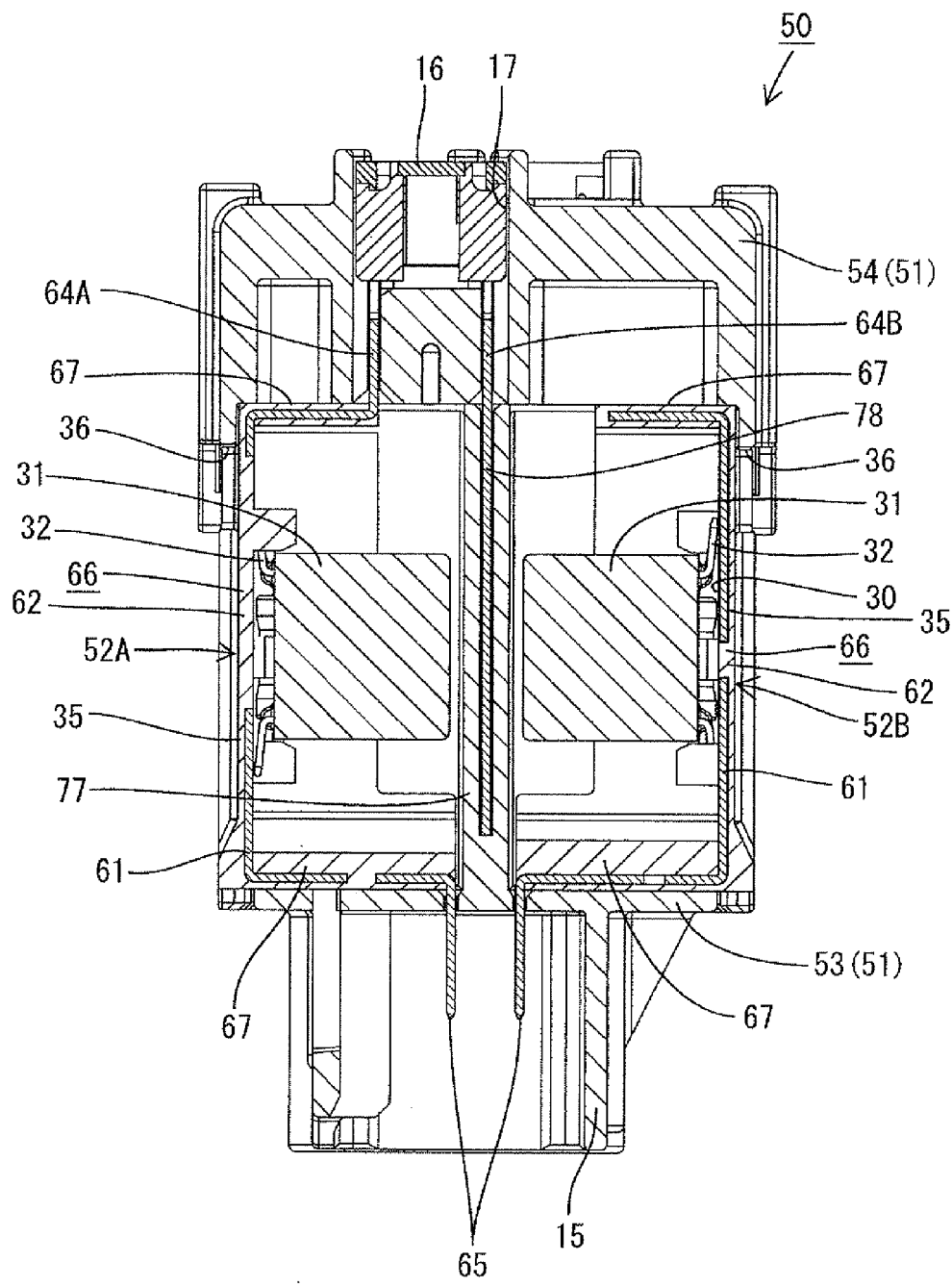
FIG. 18 is a sectional view taken along C-C line in FIG. 14.

In an electric connection box 50 according to this embodiment, as shown in FIG. 18, a front side circuit component 52A (corresponding to the circuit component) arranged to be located on the front side (the left side in FIG. 18) and a rear side circuit component 523 (corresponding to the circuit component) arranged to be located on the rear side (the right side in FIG. 18) are housed in a casing 51.

(Casing 51)

As shown in FIG. 18, a lower case 53 is made of synthetic resin and opened upward. On the upper surface of a lower wall of the lower case 53, a nipping section 77 that projects upward and extends in the left to right direction (a direction piercing through the paper surface in FIG. 18) from the vicinity of the center in the front to rear direction (the left to right direction in FIG. 18) and nips a second bus bar 78 explained later is formed (see FIG. 17).

As shown in FIG. 18 in areas partitioned in the front to rear direction (the left to right direction in FIG. 18) by the nipping section 77 in the opening of the lower case 53, the front side circuit component 52A and the rear side circuit component 52B are respectively housed from above. An upper case 54 is assembled to the lower case 53, the front side circuit component 52A, and the rear side circuit component 52B from above. The upper case 54 is made of synthetic resin and opened downward. A fuse inserting section 17 in which the fuses 16 can be inserted is opened in an upper wall of the upper case 54. The plural fuses 16 (in this embodiment, ten) are inserted in the fuse inserting section 17 (see FIG. 17).

Figure 17:
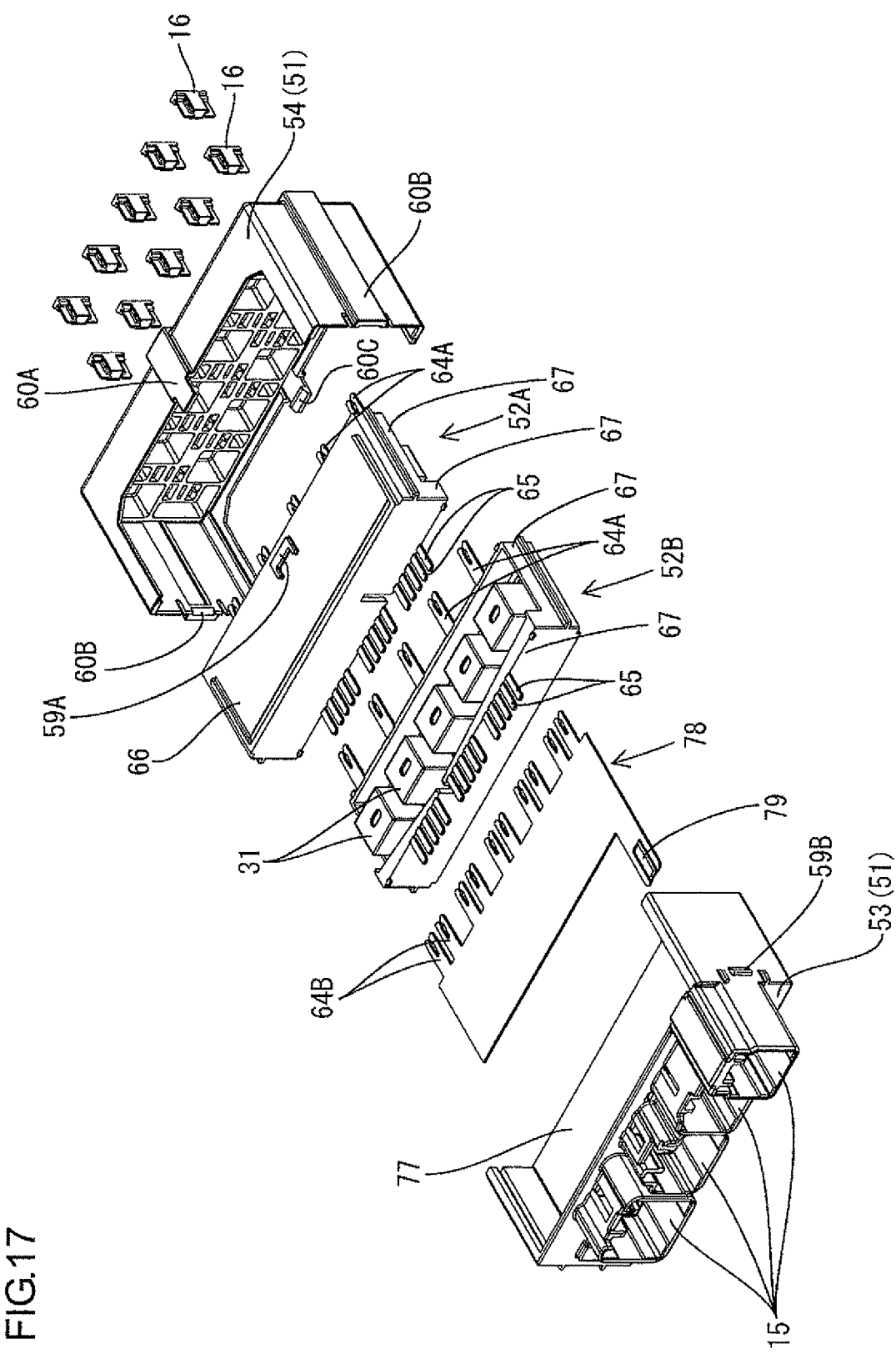
FIG. 17 is a disassembled perspective view of the electric connection box viewed from the front side.

As shown in FIG. 17, lock sections 59B projecting outward are formed on the outer surfaces of sidewalls located on both left and right sides of the lower case 53 (in a direction from the right front to the left depth in FIG. 17). On the other hand, elastically deformable lock receiving sections 60B are formed in positions corresponding to the lock sections 59B on sidewalls located on both left and right sides of the upper case 54 (in a direction from the right front to the left depth in FIG. 17). The lock sections 59B and the lock receiving sections 60B elastically fit, whereby the lower case 53 and the upper case 54 are assembled (see FIGS. 13 and 15).

(Circuit Component)

Figure 20:
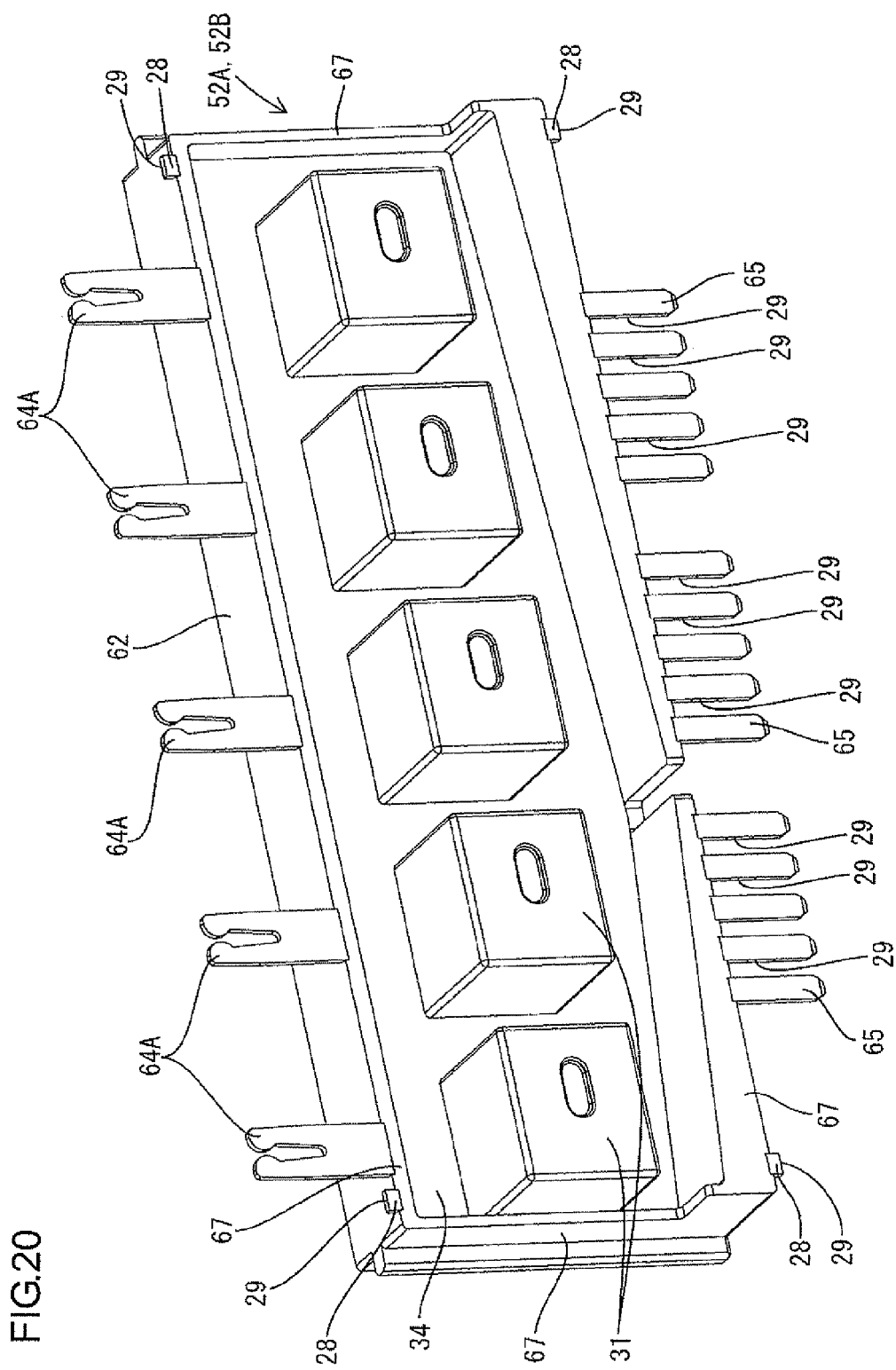
FIG. 20 is a perspective view of both circuit components.

As shown in FIGS. 18 and 20, both the circuit components 52A and 52B include plural first bus bars 61 arranged at intervals and a synthetic resin material 62 filled among the first bus bars 61. The front side circuit component 52A and the rear side circuit component 52B are formed in the same shape.

Figure 22:
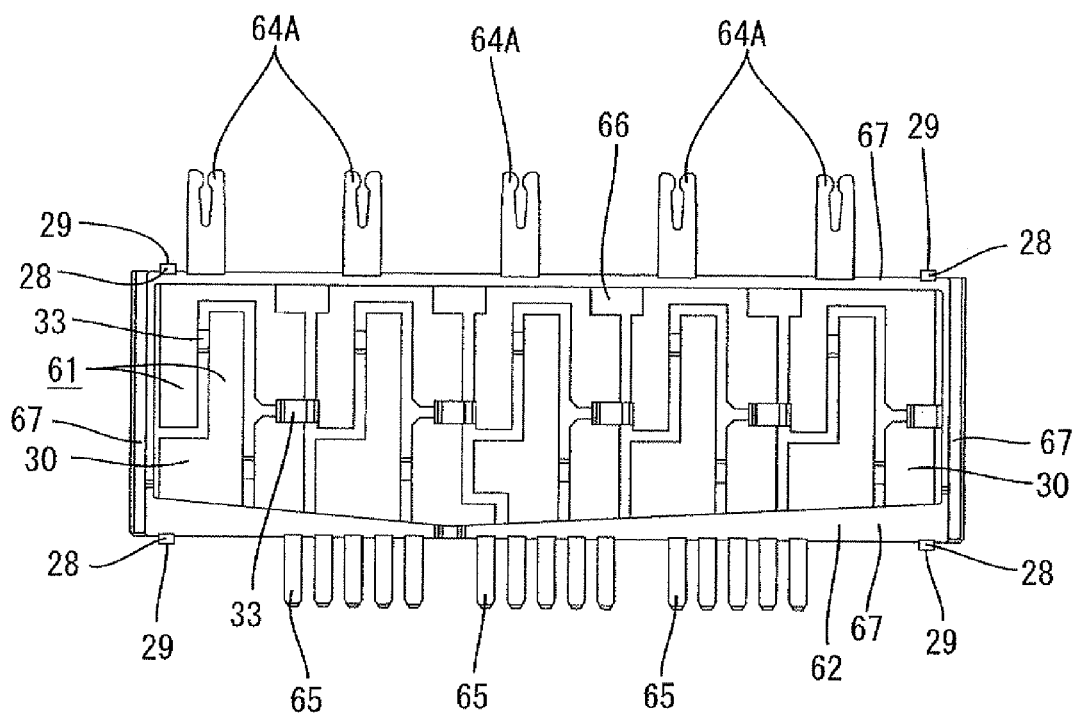
FIG. 22 is a front view showing the state in which the tie bars of the insert-molded coupled bus bars are cut.

As shown in FIG. 22, in an area between fuse side terminals 64A and connector side terminals 65 in the first bus bars 61, the synthetic resin material 62 having thermal conductivity greater than that of the air is insert-molded. The synthetic resin material 62 is filled among the first bus bars 61 adjacent to one another and closely attached to the first bus bars 61.

The upper ends of the first bus bars 61 are bent at right angle twice to the front side and formed in a crank shape. The upper ends of the first bus bars 61 are inserted into the fuse inserting section 17 and formed as the fuse side terminals 64A connected to the fuses 16. The lower ends of the first bus bars 21 are also bent at a right angle twice to the front side and formed in a crank shape. The lower ends of the first bus bars 61 are inserted in to the connector housing 15 piercing through the lower wall of the lower case 53 and formed as the connector side terminals 65 connected to counterpart connectors.

As shown in FIG. 18, bottom walls 66 are formed in both the circuit components 52A and 52B by the synthetic resin material 62. The bottom walls 66 are arranged vertically to the lower wall of the lower case 53. As shown in FIG. 22, the bottom walls 66 are formed in a substantially rectangular shape viewed from the front side. Four sidewalls 67 are formed to be vertically provided on the front side at the outer edges of the bottom walls 66. The fuse side terminals 64A (in this embodiment, five) project upward from the edge on the front side of the sidewall 67 located on the upper side among the sidewalls 67. As shown in FIG. 22, the upper ends of the fuse side terminals 64A are formed to be divided into two and formed to be capable of nipping the terminals of the fuses 16. The connector side terminals 65 project downward from the edge on the front side of the sidewall 67 located on the lower side among the sidewalls 67.

As shown in FIG. 20, the cut sections 29 obtained by cutting the tie bars 28 that couple the first bus bars 61 are formed in positions closer to the end than an area covered with the synthetic resin material 62 in the first bus bars 61.

As shown in FIG. 22, the tie bars 28 that couple the first bus bars 61 project outward from the edges on the front side of the sidewall 67 located on the upper side and the sidewall 67 located on the lower side. The tips of the tie bars 28 are cut and formed as the cut sections 29.

As shown in FIG. 18, the exposing sections 30 in which the first bus bars 61 are exposed from the synthetic resin material 62 are formed on a surface on the side on which the sidewalls 67 are vertically provided (corresponding to a first surface) in the bottom walls 66. The lead terminals 32 of the relays 31 are connected to the exposing sections 30 by, for example, soldering. In this embodiment, five relays 31 are connected to each of both the circuit components 52A and 52B.

Figure 19:
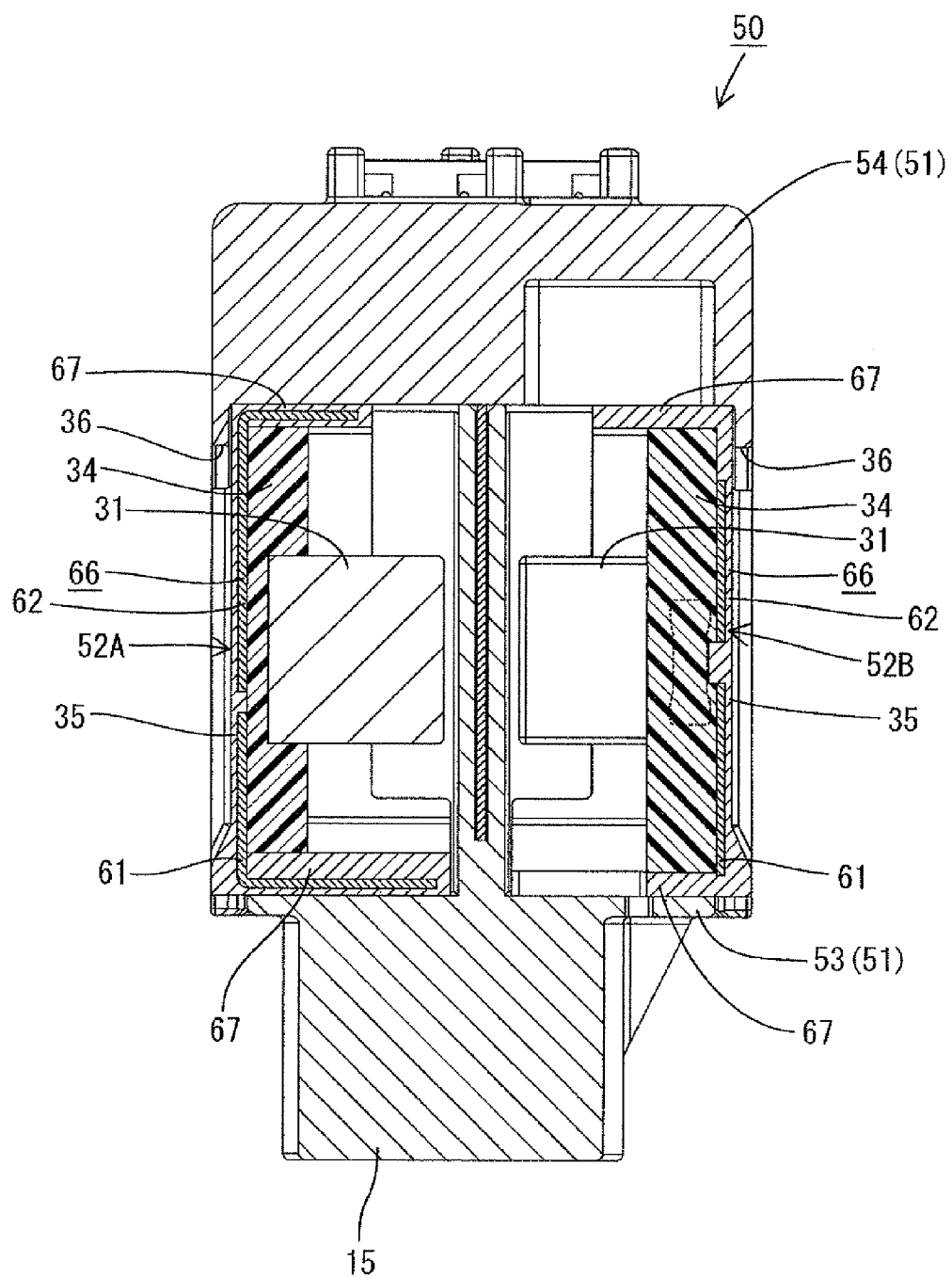
FIG. 19 is a sectional view taken along D-D line in FIG. 14.

As shown in FIGS. 19 and 20, the filler 34 formed of, for example, synthetic resin is filled in an area surrounded by the bottom walls 66 and the four sidewalls 67. The filler 34 covers the exposing sections 30 and is set in contact with the relays 31. In FIG. 18, the filler 34 is omitted.

As shown in FIG. 18, the heat equalizing layers 35 that absorb heat generated from the first bus bars 61 during energization are formed on a surface on the opposite side of the side on which the relays 31 are inserted (the front surface corresponding to a second surface) to continue to the synthetic resin material 62 filled among the adjacent first bus bars 61 and cover the rear surfaces of the first bus bars 61. The heat equalizing layers 35 that absorb heat generated from the first bus bars 61 during energization are formed on a surface on the opposite side of the side on which the relays 31 are inserted (the rear surface corresponding to a second surface) to continue to the synthetic resin material 62 filled among the adjacent first bus bars 61 and cover the rear surfaces of the first bus bars 61.

As shown in FIG. 17, a lock section 59A projecting to the front side is formed on the front surface side of the bottom wall 66 of the front side circuit component 52A (the front surface of the heat equalizing layer 35). On the other hand, as shown in FIGS. 13, 14, and 17, an elastically-deformable lock receiving section 60A is formed in a position corresponding to the lock section 59A on the outer surface on the front side of the upper case 54.

Figure 15:
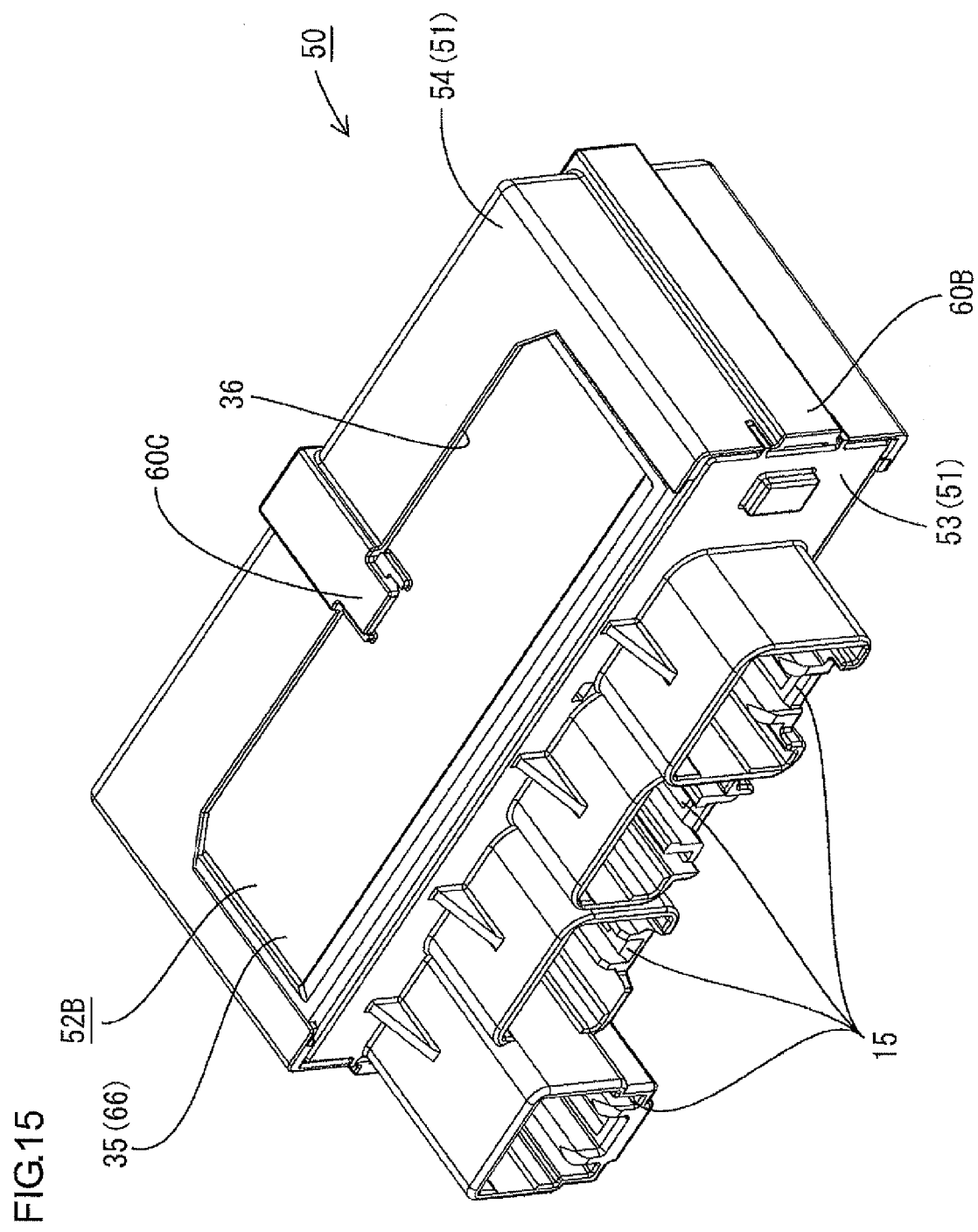
FIG. 15 is a perspective view of the electric connection box viewed from the rear side.
Figure 16:
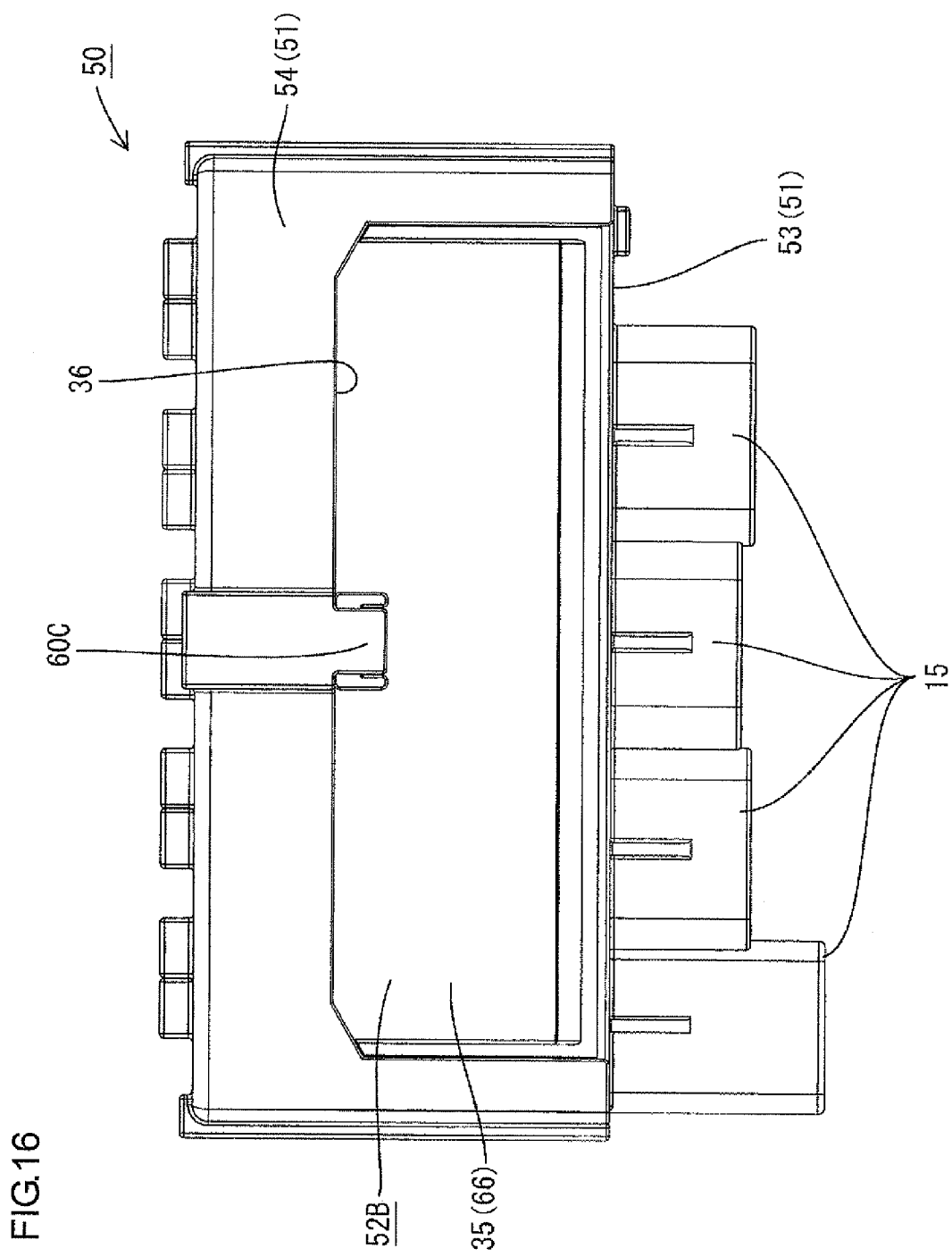
FIG. 16 is a rear view of the electric connection box.

Although not shown in the figures, a lock section 59C projecting to the rear side is formed on the rear surface side of the bottom wall 66 of the rear side circuit component 52B (the rear surface of the heat equalizing layer 35). On the other hand, as shown in FIGS. 15 and 16, an elastically-deformable lock receiving section 60C is formed in a position corresponding to the lock section 59C on the outer surface on the rear side of the upper case 54. The lock sections 59A, 59B, and 59C and the lock receiving sections 60A, 60B, and 60C elastically fit each other, whereby the circuit component 12 and the upper case 54 are assembled.

As shown in FIG. 18, both the circuit components 52A and 52B are respectively housed in areas partitioned in the front to rear direction (the left to right direction in FIG. 18) by the nipping section 77 of the lower case 53 in the casing 51. Each of both the circuit components 52A and 52B is arranged in the casing 51 in a posture in which the relay 31 is directed to the nipping section 77 side.

As shown in FIGS. 13 to 16, in a state in which the lower case 53, both the circuit components 52A and 52B, and the upper case 54 are assembled, the openings 36 are respective formed on the front surface side and the rear surface side of the lower case 53 and the upper case 54. Both the circuit components 52A and 53B are housed in the casing 51 in a posture in which these both openings 36 are closed by the heat equalizing layers 35 of the bottom walls 66 of both the circuit components 52A and 52B. In other words, the bottom walls 66 of both the circuit components 52A and 52B configure a part of the outer surface of the casing 51.

(Second Bus Bar 78)

As shown in FIGS. 18 and 19, a second bus bar 78 is nipped from the front to rear direction (the left to right direction in FIG. 18) in the nipping section 77 formed in the lower case 53. The second bus bar 78 is formed by pressing a metal plate material. The plural (in this embodiment, ten) fuse side terminals 64B inserted into the fuse inserting section 17 and connected to the fuses 16 project upward from the upper edge of the second bus bar 78. A power source side terminal 79 projecting downward is formed in a position closer to the right end (the right front side in FIG. 17) at the lower edge of the second bus bar 78. This power source side terminal 79 is inserted into the connector housing 15 piercing through the lower wall of the lower case 53 and connected to a counterpart connector connected to a battery via a wire harness.

Components other than the above are substantially the same as those in the first embodiment. Therefore, the same components are denoted by the same reference numerals and signs and redundant explanation of the components is omitted.

(Manufacturing Process)

An example of a manufacturing process for the electric connection box 50 according to this embodiment is explained. First, a metal plate material is pressed. By pressing the meal plate material, the coupled bus bars 23 having a form in which the plural first bus bars 61 are connected by the tie bars 28 are formed on the inner side of the frame 41 formed in a substantially rectangular shape.

The coupled bus bars 23 formed in the form is placed in a not-shown die and insert-molded with the synthetic resin material 62. According to this step, the bottom walls 66 and the sidewalls 67 are formed by this step.

Figure 21:
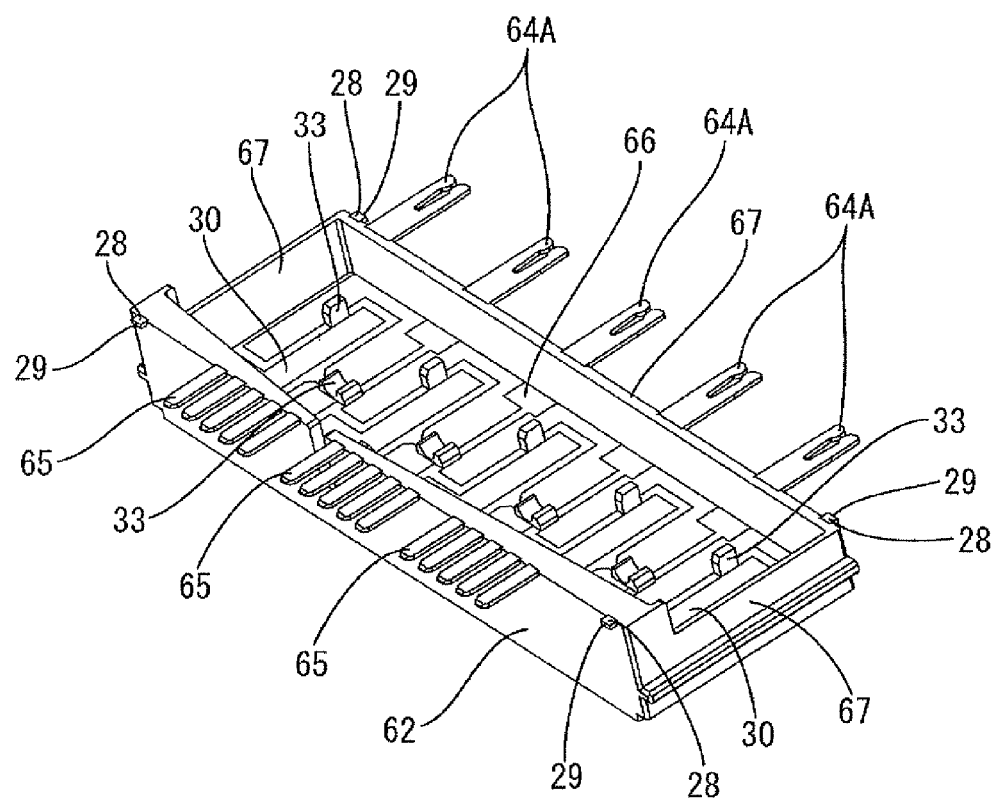
FIG. 21 is a perspective view showing a state in which tie bars of insert-molded coupled bus bars are cut.

Thereafter, as shown in FIGS. 21 and 22, the tie bars 28 that couple the adjacent first bus bars 61 are cut. By cutting the tie bars 28, the cut sections 29 are formed in the first bus bars 61. The cut sections 29 are formed in the tie bars 28 that project from the synthetic resin material 62.

The relays 31 are arranged in regular positions while the relays 31 are brought into contact with the aligning projections 33 of the bottom walls 66. Thereafter, the lead terminals 32 of the relays 31 and the first bus bars 61 exposed from the exposing sections 30 are soldered by a publicly-known method such as laser soldering or reflow soldering.

Subsequently, the circuit component 12 is placed in a posture in which the bottom walls 66 are set on the lower side and the sidewalls 67 rise upward. Thereafter, the filler 34 of a liquid form is filled in the area surrounded by the bottom walls 66 and the sidewalls 67. The filler 34 is filled to a liquid level at which the filler 34 covers the exposing sections 30 and is set in contact with the relays 31. Thereafter, the filler 34 is solidified (see FIG. 20).

The second bus bar 78 is inserted into the nipping section 77 of the lower case 53. The power source side terminal 79 of the second bus bar 78 is inserted into the connector housing 15 from above.

Next, the connector side terminals 65 of the front side circuit component 52A and the rear side circuit component 52B are inserted into the connector housing 15 from above.

Subsequently, the upper case 54 is assembled to the lower case 53 and both the circuit components 52A and 52B from above. When the upper case 54 is assembled, the fuse side terminals 64A and 64B of the first bus bars 61 and the second bus bar 78 are housed in the fuse inserting section 17 of the upper case 54. When the upper case 54 is assembled from above, the lock receiving sections 60A, 60B, and 60C of the upper case 54 come into contact with the lock sections 59A, 59B, and 59C of the lower case 53 and both the circuit components 52A and 52B from above. When the upper case 54 is displaced downward, the lock receiving sections 60A, 60B, and 60C are elastically deformed outward and thereafter deformed to be reset and elastically engage with the lock sections 59A, 59B, and 59C. Consequently, the upper case 54 is assembled integrally with the lower case 53 and both the circuit components 52A and 52B. The electric connection box 50 is completed. As shown in FIGS. 18 and 19, this electric connection box 50 is mounted on a vehicle in a posture in which the bottom walls 66 of the circuit component 12 is vertical.

In this embodiment, since the front side circuit component 52A and the rear side circuit component 52B are housed in one casing 51, it is possible to improve packaging density.

Third Embodiment

Figure 23:
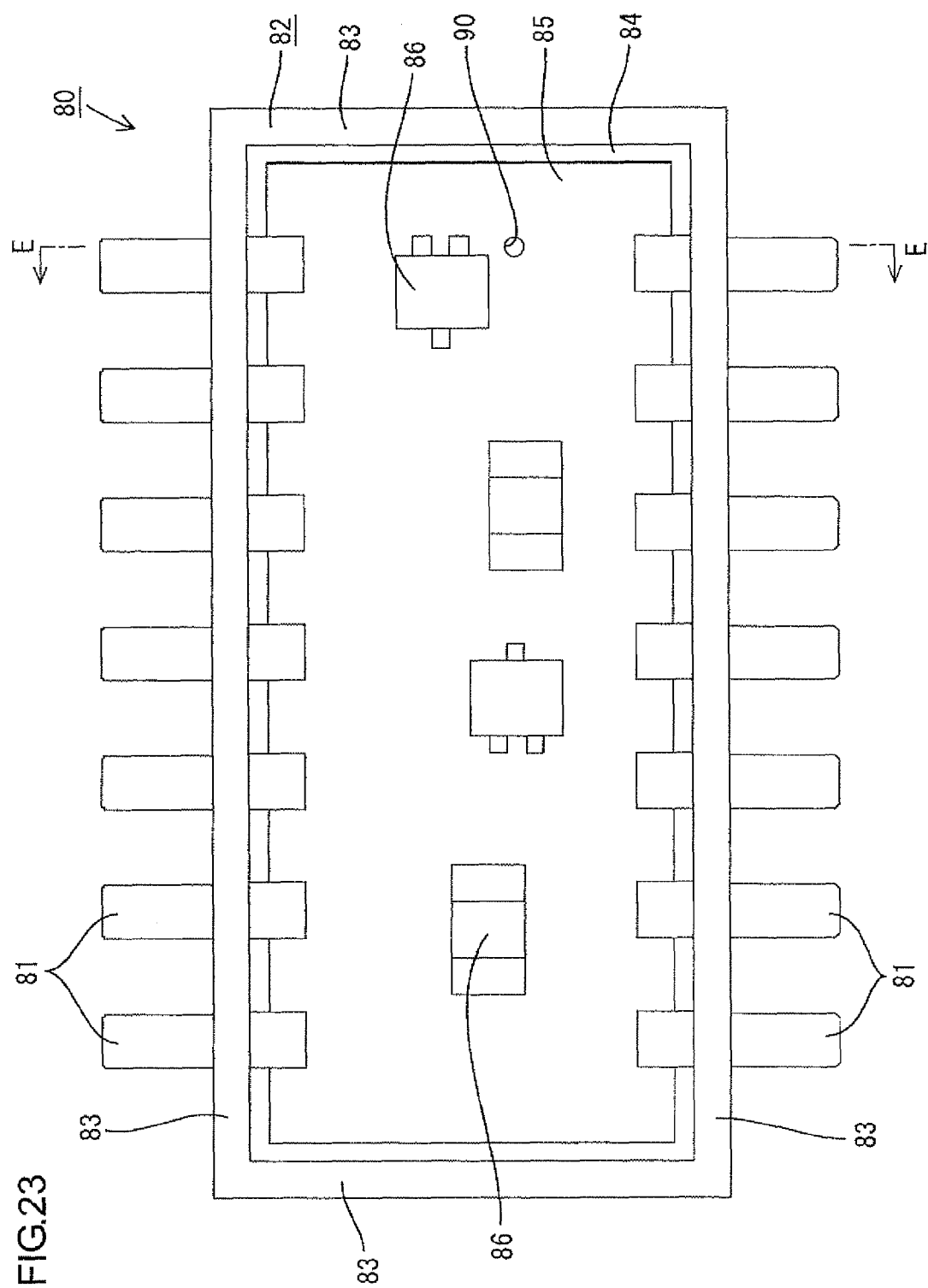
FIG. 23 is a front view showing a circuit component according to a third embodiment of the present invention.

Next, a third embodiment of the present invention is explained with reference to FIGS. 23 and 24. In the following explanation, the upper side in FIG. 23 is referred to as upward and the lower side in FIG. 23 is referred to as downward. The right side in FIG. 23 is referred to as right and the left in FIG. 23 is referred to as left. The upper side in FIG. 24 is referred to as front side and the lower side in FIG. 24 is referred to as rear side.

As shown in FIG. 23, a circuit component 80 according to this embodiment is formed in a substantially rectangular shape elongated in the left to right direction viewed from the front side (the front side in a direction piercing through the paper surface in FIG. 23). In the circuit component 80, plural first bus bars 81 arranged at intervals are provided to project upward from the upper edge of the circuit component 80 and project downward from the lower edge of the circuit component 80.

A synthetic resin material 82 having thermal conductivity greater than that of the air is arranged among the first bus bars 81 adjacent to one another. Sidewalls 83 and a bottom wall 84 are formed by this synthetic resin material 82.

Figure 24:
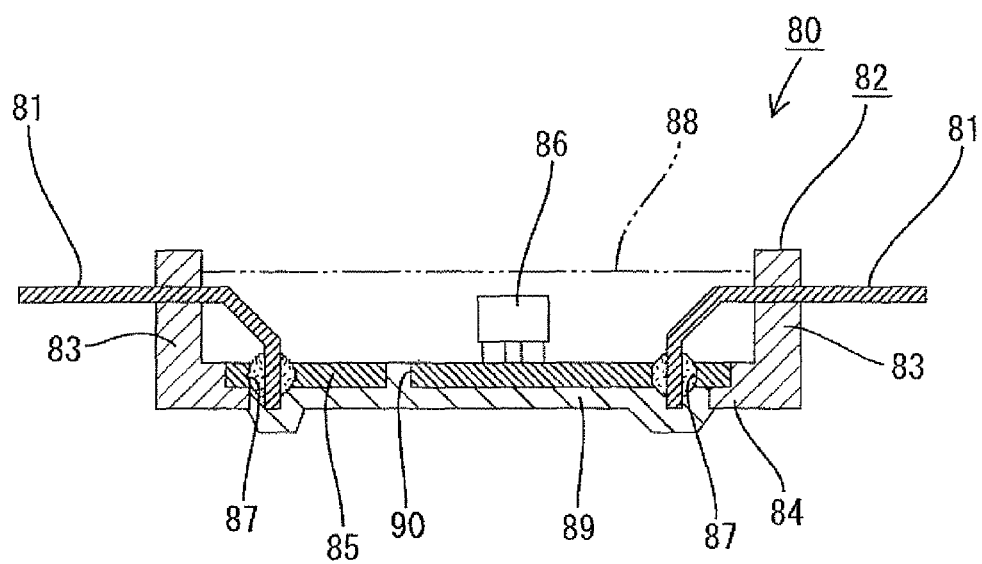
FIG. 24 is a sectional view taken along E-E line in FIG. 23.

As shown in FIG. 24, the circuit component 80 includes a circuit board 85. The circuit board 85 is formed in a substantially rectangular shape. A not-shown conducting path is formed on the surface of the circuit boar 85 (the upper surface in FIG. 24, corresponding to one surface of the circuit board 85) by a printed wiring technique. An electronic component 86 is mounted on the surface of the circuit board 85 and electrically connected to the conducting path.

Through holes 87 are formed in the circuit board 85. One ends of the first bus bars 81 are inserted into the through holes 87 and soldered. Consequently, the first bus bars 81 and the circuit board 85 are electrically connected. The first bus bars 81 are formed to be bent on the front side of the circuit board 85. Consequently, the other ends of the first bus bars 81 extend in a direction along the plate surface of the circuit board 85.

The circuit board 85 and the first bus bars 81 are molded with the synthetic resin material 82. Consequently, the sidewalls 83 and the bottom wall 84 are formed. As shown in FIG. 24, the first bus bars 81 pierce through the sidewalls 83. The surface of the circuit board 85 is in a state in which the surface is exposed from the bottom wall 84.

As shown in FIG. 24, a filler 88 that covers the surface of the circuit board 85 and is set in contact with the electronic component 86 is filled in an area surrounded by the bottom wall 84 and the sidewalls 83 in the circuit component 80. The filler 88 is in a liquid state during the filling and is solidified after the filling. In this embodiment, a part of the electronic component 86 or the entire electronic component 86 is embedded in the filler 88.

A heat equalizing layer 89 that covers the rear surface of the circuit board 85 (the lower surface in FIG. 24, corresponding to the other surface of the circuit board 85) and disperses heat generated by the circuit board 85 is formed in the bottom wall 84 of the circuit component 80. The heat equalizing layer 89 is formed by molding.

The rear surface of the circuit board 85 is covered by this heat equalizing layer 89. One ends of the first bus bars 81 inserted into the circuit board 85 are also covered by the heat equalizing layer 89. Consequently, the first bus bars 81 are insulated.

A resin filling hole 90, through which synthetic resin that forms the heat equalizing layer 89 is filled, is formed in the circuit board 85 piercing through the circuit board 85. The synthetic resin that forms the heat equalizing layer 89 is set in close contact with the inner wall surface of the resin filling hole 90. Although not shown in the figure in detail, this heat equalizing layer 89 is exposed on the outside of the casing 11 from the opening 36 of the casing 11.

Components other than the above are substantially the same as those in the first embodiment. Therefore, the same components are denoted by the same reference numerals and signs and redundant explanation of the components is omitted.

An example of a manufacturing process for the circuit component 80 according to this embodiment is explained. First, the through holes 87 are formed in the circuit board 85. Thereafter, the conducting path is formed by the printed wiring technique. Subsequently, one ends of the first bus bars 81 are inserted into the through holes 87 and soldered.

Subsequently, the circuit board 85, in which the first bus bars 81 are soldered, is placed in a not-shown die and molded with the synthetic resin material 82. By molding the circuit board 85, the bottom wall 84, the sidewalls 83, and the heat equalizing layer 89 are formed.

Next, the electronic component 86 is mounted on the surface of the circuit board 85 by a publicly-known method such as reflow soldering.

Subsequently, after the filler 88 in a liquid form is filled in the area surrounded by the bottom wall 84 and the sidewalls 83, the filler 88 is solidified. Consequently, the circuit component 80 is completed.

Another example of the manufacturing process for the circuit component 80 is explained below. First, the circuit board 85 is molded with the synthetic resin material 82. By molding the circuit board 85, the bottom wall 84, the sidewalls 83, and the heat equalizing layer 89 are formed. When the heat equalizing layer 89 is formed, openings (not shown) from which soldered sections of the first bus bars 81 and the circuit board 85 are exposed are provided in positions corresponding to the soldered sections of the first bus bars 81 and the circuit board 85.

Next, the electronic component 86 is mounted on the surface of the circuit board 85 by a publicly-known method such as reflow soldering. Subsequently, the first bus bars 81 are soldered.

Subsequently, after the filler 88 in a liquid form is filled in the area surrounded by the bottom wall 84 and the sidewalls 83, the filler 88 is solidified. Thereafter, the filler 88 is filled in the openings provided in the heat equalizing layer 89 and is solidified. As the order of filling the filler 88, the filler 88 may be filled first in either the area surrounded by the bottom wall 84 or the sidewalls 83 and the openings provided in the heat equalizing layer 89. Consequently, the circuit component 80 is completed.

According to this embodiment, since the circuit component 80 includes the circuit board 85, it is possible to improve wiring density compared with a case in which a circuit is formed by only the first bus bars 81.

According to this embodiment, the synthetic resin material 82 that forms the heat equalizing layer 89 is filled in the resin filling hole 90 to be set in close contact with the inner wall surface of the resin filling hole 90. Consequently, even when the circuit board 85 and the heat equalizing layer 89 receive force in a direction in which the circuit board 85 and the heat equalizing layer 89 peel off from each other, it is possible to suppress, with friction between the synthetic resin material 82 filled in the resin filling hole 90 and the inner wall surface of the resin filling hole 90, the circuit board 85 and the heat equalizing layer 89 from peeling off from each other.

According to this embodiment, heat generated in the circuit board 85 during energization is transmitted to the heat equalizing layer 89, which covers the rear surface of the circuit board 85, and then dispersed by the heat equalizing layer 89. The heat transmitted to the heat equalizing layer 89 is efficiently radiated to the outside of the casing 11 from the heat equalizing layer 89 exposed from the opening 36 of the casing 11. As a result, it is possible to improve heat dissipation of the electric connection box 10.

Other Embodiments

The present invention is not limited to the embodiments explained by the description and the drawings. For example, embodiments explained below are also included in the technical scope of the present invention.

(1) In the first and second embodiments, the circuit components 12, 52A, and 52B are formed by insert-molding the coupled bus bars 23. However, the circuit components 12, 52A, and 52S are not limited to this. The plural first bus bars 21 cut in advance may be arranged in predetermined positions of a die and thereafter insert-molded.

(2) In the first and second embodiments, the filler 34 is filled in the circuit components 12, 52A, and 52B. However, the filler 34 can be omitted if the heat generated from the first bus bars 21 or 61 or the relay 31 can be efficiently radiated by the synthetic resin material 22.

(3) In the first and second embodiments, the heat equalizing layer 35 is formed in the circuit components 12, 52A, and 52B. However, the circuit components 12, 52A, and 52B are not limited to this. For example, the heat equalizing layer 35 can be omitted if the heat generated from the first bus bars 21 or 61 or the relay 31 can be efficiently radiated by the synthetic resin material 22. In this case, the first bus bars 21 and 61 are exposed on the rear surface of the bottom wall 26 of the circuit component 12. Then, it is apprehended that water or dust adheres to the first bus bars 21 and 61 exposed on the rear surface of the bottom wall 26 and the first bus bars 21 and 61 are short-circuited. Therefore, in this case, the opening 36 is not provided in the casings 11 and 15 and the circuit components 12, 52A, and 52B are covered by the casings 11 and 51. This makes it possible to suppress water or dust from adhering to the first bus bars 21 and 61 exposed on the rear surface of the bottom wall 26.

(4) In the first and second embodiments, the relay 31 is used as the electronic component. However, the electronic component is not limited to this and may be a semiconductor relay or may be a resistor, a capacitor, or the like.

(5) In the third embodiment, the heat equalizing layer 89 is formed in the circuit component 80. However, the circuit component 80 is not limited to this. The heat equalizing layer 89 may be omitted. When the heat equalizing layer 89 is omitted, it is apprehended that water or dust adheres to the circuit board 85 exposed on the rear surface of the bottom wall 84 and the circuit board 85 is short-circuited. Therefore, in this case, the opening is not provided in the casing and the circuit component 80 is covered by the casing. This makes it possible to suppress water or dust from adhering to the circuit board 85 exposed on the rear surface of the bottom wall 84.

(6) In the embodiments, the circuit formed by the bus bars may be formed by a thick copper circuit.

The invention claimed is:

1. An electric connection box comprising:
a casing; and
a circuit component housed in the casing;
wherein the circuit component includes plural bus bars arranged at intervals and a synthetic resin material arranged among the plural bus bars adjacent to one another and closely attached to the bus bars, thermal conductivity of the synthetic resin material being greater than that of air; and a bottom wall and sidewalls vertically provided from an outer peripheral edge of the bottom wall,
wherein the bottom wall has a first surface on a side on which the sidewalls are vertically provided; an exposing section that is provided on the first surface, the exposing section exposes one of the bus bars from the synthetic resin material; an electronic component that is connected to the bus bar exposed from the exposing section; a second surface on an opposite side of the first surface; and a heat equalizing layer that is provided on the second surface of the bottom wall, continues to the synthetic resin material, covers the bus bars, and disperses heat generated from the bus bars.

2. The electric connection box according to claim 1, wherein the casing includes an opening, and at least a part of the circuit component is exposed in the opening.

3. The electric connection box according to claim 1, wherein the synthetic resin material is filled among the bus bars.

4. The electric connection box according to claim 1, wherein:
the bus bars project outward from the synthetic resin material of the circuit component, and
cut sections are provided in the bus bars projecting from the synthetic resin material, the cut sections are formed by cutting tie bars that couple the plural bus bars.

5. The electric connection box according claim 1, wherein:
tie bars that couple the plural bus bars project outward from the synthetic resin material of the circuit component, and
cut sections are provided in the tie bars projecting from the synthetic resin material, the cut sections are formed by cutting the tie bars.

6. The electric connection box according to claim 1, wherein:
a filler is filled in an area surrounded by the bottom wall and the sidewalls; and
the filler covers the exposing section and is set in contact with the electronic component.

7. The electric connection box according to claim 1, wherein the heat equalizing layer of the circuit component is exposed in the opening of the casing.

8. The electric connection box according to claim 1, wherein the circuit component includes a circuit board that is electrically connected to the bus bars.

9. The electric connection box according to claim 8, wherein the casing includes an opening, and at least a part of the circuit component is exposed in the opening.

10. The electric connection box according to claim 8, wherein:
one surface of the circuit board is exposed from the first side of the bottom wall; and
an electric component is connected to the one surface of the circuit board.

11. The electric connection box according to claim 10, wherein:
a filler is filled in an area surrounded by the bottom wall and the sidewalls; and
the filler covers the one surface of the circuit board and is set in contact with the electronic component.

12. The electric connection box according to claim 10, wherein:
the heat equalizing layer covers another surface of the circuit board, and disperses heat generated by the circuit board during energization.

13. The electric connection box according to claim 12, wherein the heat equalizing layer of the circuit component is exposed in the opening of the casing.

14. The electric connection box according to claim 12, wherein the circuit board includes a resin filling hole piercing through the circuit board, the synthetic resin that forms the heat equalizing layer is filled in the resin filling hole to be set in close contact with the inner wall surface of the resin filling hole.

15. An electric connection box comprising:
a casing; and
a circuit component housed in the casing;
wherein the circuit component includes plural bus bars arranged at intervals and a synthetic resin material arranged among the plural bus bars adjacent to one another and closely attached to the bus bars, thermal conductivity of the synthetic resin material being greater than that of air; a circuit board that is electrically connected to the bus bars; and a bottom wall and sidewalls vertically provided from an outer peripheral edge of the bottom wall,
wherein the bottom wall has a first surface on a side on which the sidewalls are vertically provided; one surface of the circuit board that is exposed from the first side of the bottom wall; an electric component that is connected to the one surface of the circuit board; a second surface on an opposite side of the first surface; and a heat equalizing layer made of synthetic resin that is provided on the second surface of the bottom wall, covers another surface of the circuit board, and disperses heat generated by the circuit board during energization.

* * * * *